(12) United States Patent
Aggarwal et al.

(10) Patent No.: US 7,449,071 B2
(45) Date of Patent: Nov. 11, 2008

(54) WAFER HOLDER WITH PERIPHERAL LIFT RING

(75) Inventors: Ravinder K. Aggarwal, Gilbert, AZ (US); Tony J. Keeton, Chandler, AZ (US); Matthew G. Goodman, Chandler, AZ (US)

(73) Assignee: ASM America, Inc., Phoenix, AZ (US)

( * ) Notice: Subject to any disclaimer, the term of this patent is extended or adjusted under 35 U.S.C. 154(b) by 357 days.

(21) Appl. No.: 10/903,083

(22) Filed: Jul. 30, 2004

(65) Prior Publication Data

US 2005/0011458 A1    Jan. 20, 2005

Related U.S. Application Data

(62) Division of application No. 10/100,308, filed on Mar. 15, 2002, now Pat. No. 6,776,849.

(51) Int. Cl.
*C23C 16/00* (2006.01)
*C23F 1/00* (2006.01)
*H01L 21/306* (2006.01)

(52) U.S. Cl. .................. 118/725; 118/728; 118/729; 118/730; 156/345.51; 156/345.52; 156/345.53; 156/345.54; 156/345.55

(58) Field of Classification Search .................. 118/729, 118/730; 156/345.54, 345.55; 427/255.28, 427/680, 890
See application file for complete search history.

(56) References Cited

U.S. PATENT DOCUMENTS 4,116,733 A    9/1978   Olsen et al.
4,958,061 A    9/1990   Wakabayashi et al.
5,011,794 A    4/1991   Grim et al.
5,033,407 A    7/1991   Mizuno et al.
5,098,198 A    3/1992   Nulman et al.
5,156,820 A   10/1992   Wong et al.
5,199,483 A    4/1993   Bahng
5,215,619 A    6/1993   Cheng et al.

(Continued)

FOREIGN PATENT DOCUMENTS

EP         0 553 691 A1    4/1993

(Continued)

*Primary Examiner*—Parviz Hassanzadeh
*Assistant Examiner*—Rakesh K Dhingra
(74) *Attorney, Agent, or Firm*—Knobbe Martens Olson & Bear LLP

(57) ABSTRACT

A wafer holder for supporting a wafer within a CVD processing chamber includes a vertically moveable lift ring configured to support the bottom peripheral surface of the wafer, and an inner plug having a top flat surface configured to support the wafer during wafer processing. The lift ring has a central aperture configured to closely surround the inner plug. When a wafer is to be loaded onto the wafer holder, the lift ring is elevated above the inner plug. The wafer is loaded onto the lift ring in the elevated position. Then, the lift ring is maintained in the elevated position for a time period sufficient to allow the wafer temperature to rise to a level that is sufficient to significantly reduce or even substantially prevent thermal shock to the wafer when the wafer is brought into contact with the inner plug. The lift ring is then lowered into surrounding engagement with the inner plug. This is the wafer processing position of the wafer holder.

16 Claims, 19 Drawing Sheets

U.S. PATENT DOCUMENTS

| | | | |
|---|---|---|---|
| 5,242,501 A | 9/1993 | McDiarmid | |
| 5,298,465 A | 3/1994 | Levy | |
| 5,383,971 A | 1/1995 | Selbrede | |
| 5,421,893 A | 6/1995 | Perlov | |
| 5,444,217 A | 8/1995 | Moore et al. | |
| 5,456,757 A | 10/1995 | Aruga et al. | |
| 5,462,603 A | 10/1995 | Murakami | |
| 5,527,393 A | 6/1996 | Sato et al. | |
| 5,551,985 A | 9/1996 | Brors et al. | |
| 5,558,717 A | 9/1996 | Zhao et al. | |
| 5,584,936 A | 12/1996 | Pickering et al. | |
| 5,777,979 A | 7/1998 | Hensel et al. | |
| 5,803,977 A | 9/1998 | Tepman et al. | |
| 6,022,586 A | 2/2000 | Hashimoto et al. | |
| 6,044,534 A | 4/2000 | Seo et al. | |
| 6,068,441 A | 5/2000 | Raaijmakers et al. | |
| 6,086,680 A | 7/2000 | Foster et al. | |
| 6,090,212 A | 7/2000 | Mahawili | |
| 6,111,225 A * | 8/2000 | Ohkase et al. | 219/390 |
| 6,364,957 B1 * | 4/2002 | Schneider et al. | 118/728 |
| 6,413,321 B1 * | 7/2002 | Kim et al. | 118/725 |
| 6,464,825 B1 * | 10/2002 | Shinozaki | 156/345.55 |
| 6,676,759 B1 | 1/2004 | Takagi | |
| 6,788,991 B2 | 9/2004 | De Haas et al. | |
| 6,835,039 B2 | 12/2004 | van den Berg et al. | |
| 7,033,126 B2 | 4/2006 | Van Den Berg | |
| 2001/0035131 A1 * | 11/2001 | Sakuma et al. | 118/724 |
| 2003/0029384 A1 * | 2/2003 | Nishikawa | 118/730 |
| 2004/0076411 A1 * | 4/2004 | Kanno et al. | 392/416 |

FOREIGN PATENT DOCUMENTS

| | | |
|---|---|---|
| EP | 0 634 785 A1 | 1/1994 |
| EP | 0 840 358 A2 | 3/1997 |
| GB | 2181 458 A | 7/1985 |
| JP | 11251257 A | 9/1999 |
| JP | 2000-012549 * | 1/2000 |
| JP | 2000012549 A | 1/2000 |
| JP | WO 00/26961 * | 5/2000 |
| JP | 2001313329 A | 11/2001 |
| WO | WO 97/08743 | 3/1997 |
| WO | WO 00/26961 | 5/2000 |

* cited by examiner

WAFER HOLDER WITH PERIPHERAL LIFT RING

REFERENCE TO RELATED APPLICATIONS

The present application is a divisional of U.S. patent application Ser. No. 10/100,308, filed Mar. 15, 2002 now U.S. Pat. No. 6,776,849.

BACKGROUND OF THE INVENTION

1. Field of the Invention

This invention relates generally to supports for wafers in semiconductor processing chambers and, more particularly, to a wafer holder for supporting a wafer within a cold wall chemical vapor deposition chamber.

2. Description of the Related Art

High-temperature ovens, or reactors, are used to process semiconductor wafers from which integrated circuits are made for the electronics industry. A substrate, typically a circular silicon wafer, is placed on a wafer holder. If the wafer holder helps to attract heat, it is called a susceptor. The wafer and wafer holder are enclosed in a quartz chamber and heated to high temperatures, such as 600° C. (1112° F.) or higher, by a plurality of radiant lamps placed around the quartz chamber. A reactant gas is passed over the heated wafer, causing the chemical vapor deposition (CVD) of a thin layer of the reactant material on the wafer. Through subsequent processes in other equipment, these layers are made into integrated circuits, with a single layer producing from tens to thousands of integrated circuits, depending on the size of the wafer and the complexity of the circuits.

If the deposited layer has the same crystallographic structure as the underlying silicon wafer, it is called an epitaxial layer. This is also sometimes called a monocrystalline layer because it has only one crystal structure.

Various CVD process parameters must be carefully controlled to ensure the high quality of the deposited films and the resulting semiconductor. One such critical parameter is the temperature of the wafer during the processing. The deposition gas reacts at particular temperatures and deposits on the wafer. If the temperature varies greatly across the surface of the wafer, uneven deposition of the reactant gas occurs. Similarly, temperature uniformity can be important for a variety of other semiconductor fabrication processes, such as etching, annealing, doping, etc.

Rotatable wafer holders are known in the art. Rotation of the wafer holder results in more uniform temperature distribution and deposition across the wafer.

In recent years, single-wafer processing of larger diameter wafers has grown for a variety of reasons including its greater precision as opposed to processing batches of wafers at the same time. Although single-wafer processing by itself provides advantages over batch processing, control of process parameters and throughput remains critical. In systems in which the wafer is supported in intimate contact with a large-mass, slab-like susceptor, the necessity of maintaining uniform susceptor temperature during heat-up and cool-down cycles limits the rate at which the temperature could be changed. For example, in order to maintain temperature uniformity across the susceptor, the power input to the edges of the susceptor had to be significantly greater than the power input to the center due to the edge effects.

As explained above, CVD processing often occurs at temperatures of 600° C. (1112° F.) or higher. One common problem associated with CVD processing is that, when a cold wafer is loaded onto the top surface of a susceptor inside a pre-heated reaction chamber, the wafer tends to experience "thermal shock" due to thermal gradients within the wafer from sudden conductive heat transfer from the hot susceptor to the cold wafer. These thermal stresses can result in wafer "curl" and "pop," as well as damage to the backside of the wafer. The largest problem associated with such thermal gradients is wafer pop, which causes the wafer to move randomly on the susceptor surface. This movement causes temperature non-uniformities, which reduces the repeatability of process characteristics such as thickness uniformity.

One method to reduce the problems associated with thermal shock is to substantially decrease wafer load temperatures. This is not common because it adversely affects throughput, since the temperature must be decreased before each new wafer is loaded and then increased before processing of the wafer can begin. Decreases in throughput results in decreased production and greater manufacturing costs. Thus, in order to maintain a desired throughput, some degree of wafer curl and pop are usually tolerated.

Some susceptors are equipped with vertically oriented lift pins that are vertically moveable through holes in the surface of the susceptor upon which the wafer rests. When the lift pins are elevated, the wafer is separated from the susceptor surface so as to slow heat transfer from the susceptor to the wafer. This permits the wafer to preheat, thus reducing thermal gradients when the wafer is lowered into contact with the susceptor. When the lift pins are lowered, the wafer is brought into flush contact with or very close to the susceptor surface, permitting conductive heat transfer therebetween.

Presently, there is a need for an improved wafer support system, which permits higher wafer load temperatures while avoiding the problems associated with thermal shock.

SUMMARY OF THE INVENTION

It is a principle object and advantage of the present invention to provide an improved wafer support system that permits a cold wafer to be loaded into a pre-heated reaction chamber while avoiding the above-mentioned problems associated with thermal shock.

Prior art susceptors utilizing lift pins can reduce the effects of thermal shock by permitting the loading of a wafer onto the lift pins in their elevated positions. When the wafer is in the elevated position, the wafer temperature can be permitted to increase much more gradually than would occur if the wafer were immediately brought into flush contact with a flat surface of the susceptor. In order to reduce the risk of thermal shock, the wafer can be maintained in the elevated position until the wafer temperature increases to a degree such that the likelihood of thermal shock is substantially reduced or eliminated when the wafer is eventually lowered onto the susceptor surface.

One problem with lift pins is that they tend to scratch the lower surface of the wafer, which in turn increases the likelihood of crystallographic slip. Slip is a defect in the crystalline structure of the wafer, which destroys any devices through which it may pass. The presence of scratches on a wafer causes slip to occur in the wafer at lower temperatures than if no scratches are present. In other words, the presence of scratches makes a wafer less robust and less able to tolerate high temperatures. Scratches also increase the susceptibility of a wafer to slip under rapidly varying temperature conditions. In addition, scratches cause nodule growth on the backside of the wafer, which leads to alignment problems during photolithography.

The preferred embodiments of the present invention solve this problem by providing a vertically moveable lift ring that supports the outer radial periphery of a wafer. The lift ring can be raised above the remaining portions of the susceptor to receive a newly loaded wafer. In the raised position, the only heat conduction received by the wafer is via the peripheral lift ring. Heat conduction between the remainder of the susceptor and the raised wafer is substantially prevented. Moreover, heat conduction to the wafer is localized at the wafer periphery, preferably in the exclusion zone of the wafer. When the wafer is in the raised position, the majority of the heat received by the wafer is in the form of (1) radiation from the heated susceptor (from both the lift ring and the remainder of the susceptor), (2) radiation from the heat lamps, if they are on, and (3) convection from warm gas within the chamber. In addition, as indicated above, some heat is received at the wafer edge in the form of conduction from the lift ring. The wafer can be maintained in the raised position until the wafer temperature rises to a level sufficient to substantially prevent or significantly reduce thermal shock to the wafer when the wafer is eventually lowered onto the remainder of the susceptor. The lift ring provides more stable support to the wafer than lift pins. Further, in contrast to lift pins, the lift ring does not have any sharp contact surfaces that might scratch the wafer. The upper surface of the lift ring is preferably flat and only contacts the wafer near its outer radial edge.

As used herein, heat "conduction" refers to the transfer of energy arising from the temperature difference between adjacent bodies. It is not uncommon for skilled artisans to understand heat conduction to include heat transfer across small gaps. However, for the purposes of the present application, "conduction" does not include heat transfer across small gaps.

In one aspect, the present invention provides a susceptor for supporting a wafer within a reaction chamber, comprising an inner plug, a lift ring, and a lift device. The inner plug can have a generally flat top surface, a gridded surface including grooves, a concave gridded surface, or other configuration. The lift ring has an upper wafer support surface configured to support a bottom outer peripheral surface of a wafer. The lift ring also has a central aperture positioned such that the lift ring contacts only a peripheral portion of a wafer supported thereon. The central aperture is sized and shaped to closely receive the inner plug. The lift ring has a lowered position in which the wafer support surface is generally at the same vertical position as a top surface of the inner plug. The lift ring also has an elevated position in which the wafer support surface is above the top surface of the inner plug such that a wafer supported on the lift ring substantially does not contact the inner plug. The lift device operates to move the lift ring between its lowered position and its elevated position.

In another aspect, the present invention provides a reactor having a susceptor as described in the previous paragraph.

In another aspect, the present invention provides a support spider for supporting a susceptor such as the one described above. The support spider comprises a generally vertical shaft having a vertical center axis, a plurality of support arms extending from the shaft, and intermediate support members. The support arms comprise generally horizontal portions and generally vertical portions. The horizontal portions extend generally radially outward from the shaft to outer ends, and the vertical portions extend generally upward from the outer ends of the horizontal portions. The vertical portions have upper ends configured to be underneath the lift ring when the vertical center axis of the shaft is generally aligned with a vertical center axis of the susceptor. The intermediate support members extend generally vertically from the horizontal portions, are positioned radially inward of the vertical portions, and have upper ends positioned below the upper ends of the vertical portions. The spider is configured to be positioned underneath the susceptor such that the spider can be rotatated about the center axis of the shaft and vertically displaced. When the center axes of the shaft and the susceptor are generally aligned, the spider has a position in which an upward displacement of the spider of a first distance causes the vertical portions to lift the lift ring above the inner plug without the inner plug being lifted. An upward displacement of the spider beyond the first distance causes the intermediate support members to lift the inner plug while the vertical portions support the lift ring above the inner plug.

In another aspect, the present invention provides a method of processing a wafer on a susceptor such as the one described above, within a processing chamber. In this method, the lift device comprises a support spider having arms extending radially outward and upward to contact a bottom surface of the susceptor. The spider is vertically moveable and rotatable about a vertical axis. According to the method, with the lift ring in the lowered position thereof, the inner plug is supported on the spider. The spider is lowered to a position such that the inner plug becomes supported on transition support members of the processing chamber, the lift ring still supported on the inner plug. The spider is rotated such that its arms are underneath and positioned to contact portions of the lift ring but not the inner plug if the spider is elevated. The spider is elevated such that the lift ring moves to the elevated position thereof. A wafer is loaded onto the lift ring in the elevated position thereof. The temperature of the wafer is permitted to increase to a level sufficient to substantially minimize thermal shock to the wafer when the wafer is placed into contact with the top surface of the inner plug. The spider is lowered such that the lift ring moves to the lowered position thereof and the wafer becomes supported on the top surface of the inner plug.

In another aspect, the present invention provides an apparatus for supporting a wafer within a reaction chamber. The apparatus comprises an inner portion, a lift ring, and a lift device. The inner portion has a top wafer support surface configured to support a bottom central surface of a wafer. The lift ring has an upper wafer support surface configured to support a bottom outer peripheral surface of a wafer. The lift device operates to move the lift ring vertically with respect to the inner portion.

In yet another aspect, the present invention provides a method of loading a wafer into a processing chamber having a temperature higher than that of the wafer. According to the method, a wafer is positioned onto a lift ring within a processing chamber such that a bottom outer peripheral surface of the wafer is supported by an upper wafer support surface of the lift ring. The lift ring has a central aperture configured so that substantially only a peripheral portion of the wafer is in contact with the lift ring. The lift ring is lowered into surrounding engagement with an inner plug having a top surface, so that the inner plug is positioned within the central aperture of the lift ring. In the lowered position of the lift ring, the top surface of the inner plug and the upper wafer support surface of the lift ring are generally coplanar, at least one of such surfaces supporting a bottom surface of the wafer.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

DETAILED DESCRIPTION OF THE PREFERRED EMBODIMENTS

Figure 1:
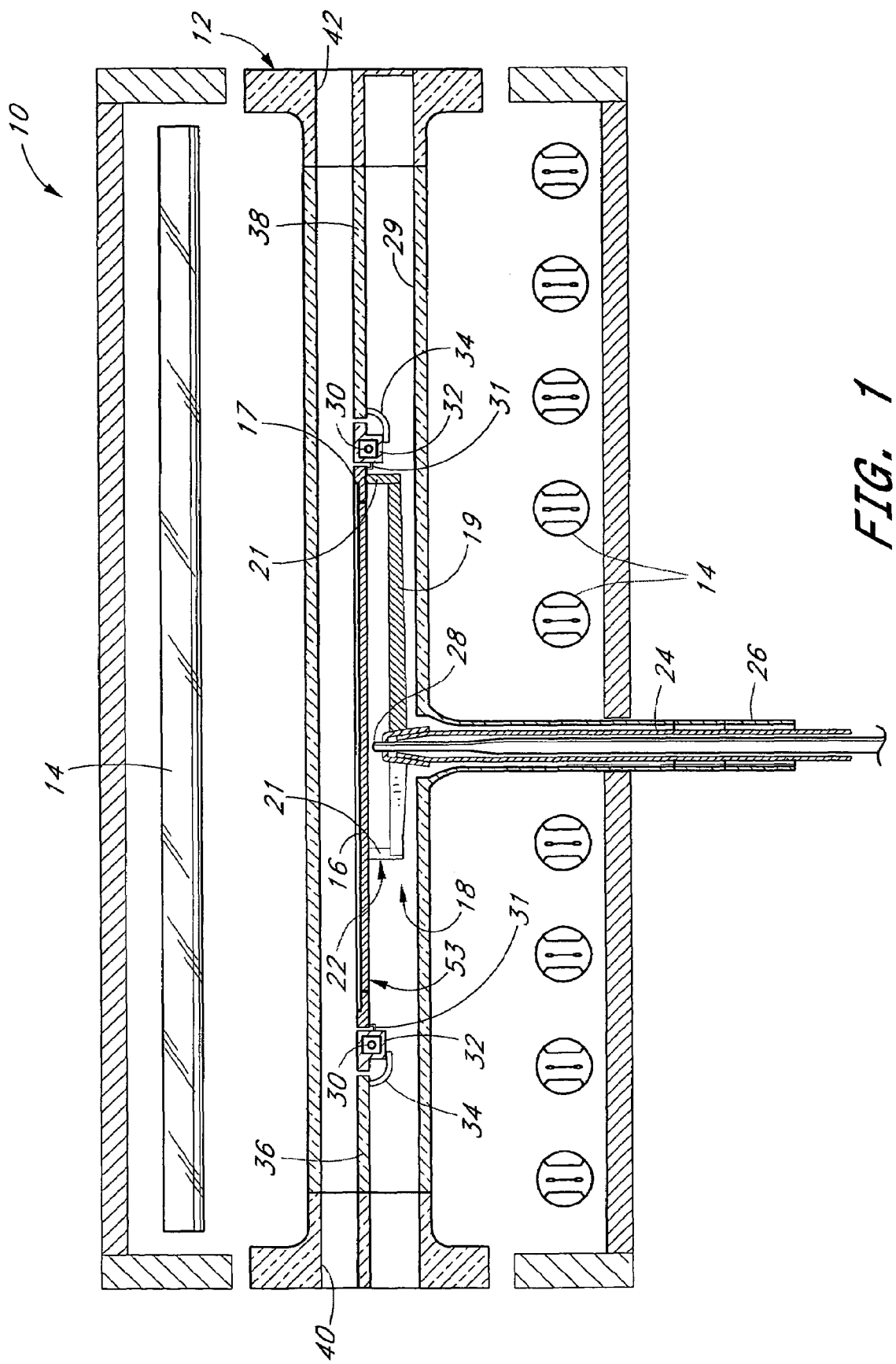
FIG. 1 is a schematic illustration of a reactor having a susceptor according to the present invention.

Contained herein are descriptions of several different embodiments of wafer holders having features in accordance with the teachings of the present invention. It will be understood that these wafer holders can be placed within "hot wall" reactors or "cold wall" reactors. In the latter case, these wafer holders can be susceptors that absorb radiant energy from the heating elements. Various susceptors according to the invention are illustrated and described herein, including susceptor 50 (shown in FIGS. 2-4), susceptor 57 (FIG. 5), susceptor 51 (FIG. 6), and susceptor 53 (FIG. 7), each of which are described in further detail below. Any of these and other susceptors according to the invention can be used within a reactor. FIG. 1 illustrates an exemplary reactor containing the susceptor 53 of FIG. 7. The skilled artisan will understand that any of the herein illustrated susceptors can be provided within the reactor illustrated in FIG. 1.

As explained above, FIG. 1 illustrates an exemplary chemical vapor deposition (CVD) reactor 10, including a quartz reaction chamber 12. Radiant heating elements 14 are supported outside the chamber 12, to provide heat energy to the chamber 12 without appreciable absorption by the quartz chamber 12 walls. While the preferred embodiments are described in the context of a "cold wall" CVD reactor, it will be understood that the wafer support systems described herein will have utility in the context of reactors of other types. In particular, one of skill in the art can find application for the wafer support systems described herein for other semiconductor processing equipment, wherein a wafer is to be supported while being uniformly heated or cooled. Moreover, the term "wafer" support systems described herein can support any, of a number of substrates, such as glass, which are to be subjected to treatment in reaction chambers, such as CVD, physical vapor deposition ("PVD"), etching, anneal, dopant diffusion, photolithographic, etc. The wafer supports are of particular utility for supporting substrates during treatment processes at elevated temperatures.

A wafer 16 with an outer radial edge 17 is shown supported within the reaction chamber 12 upon a wafer support structure 18, constructed in accordance with a first preferred embodiment of present invention. The illustrated support structure 18 includes a wafer holder or susceptor 53 (illustrated in further detail in FIG. 7), upon which the wafer 16 rests, and a support spider 22. The illustrated spider 22 has three L-shaped support arms 19 angularly spaced apart at 120° intervals about the vertical axis of the susceptor 53. Any number of support arms 19 can be provided, but three are preferred for a desirable balance of stability and simplicity. Also, the support arms can be spaced apart at any desired angles about the center axis. A vertical susceptor support member 21 is attached at the end of each support arm 19 for supporting the susceptor 53. The spider 22 is mounted to a shaft 24, which extends downwardly through a tube 26 depending from the chamber 12 lower wall. Preferably, the shaft 24, spider 22, and susceptor 53 are rotatable about the vertical center axis thereof.

As used herein, the term "outer radial edge" of a wafer refers to the vertical or generally vertical side surfaces of the wafer. The term "bottom outer peripheral surface" of a wafer refers to the bottom surface of the wafer near the outer radial edge. The term "peripheral" means at or near the radial periphery of the wafer.

A central temperature sensor or thermocouple 28 desirably mounts upon the spider 22 in proximity to the susceptor 53. Additional peripheral thermocouples 30 are also shown, housed within a ring 32 which surrounds the susceptor 53 and wafer 16. The thermocouples 28, 30 are connected to a temperature controller (not shown), which sets the power of the various heating elements 14 in response to the readings of the thermocouples 28, 30.

In addition to housing the thermocouples 30, the ring 32 absorbs radiant heat during high temperature processing. This compensates for a tendency toward greater heat loss at wafer edges 17, a phenomenon that is known to occur due to a greater concentration of surface area for a given volume near such edges. By minimizing edge losses and the attending radial temperature non-uniformities across the wafer 16, the ring 32 can prevent wafer crystallographic slip. The ring 32 can be suspended by any suitable means. For example, the illustrated ring 32 rests upon elbows 34 that depend from a front chamber divider 36 and a rear chamber divider 38. The dividers 36, 38 are desirably formed of quartz.

The illustrated reaction chamber 12 includes an inlet port 40 for the injection of reactant and carrier gases. An outlet port 42 is on the opposite side of the chamber 12, with the wafer support structure 18 positioned between the inlet 40 and the outlet 42, to define a laminar horizontal gas flow path over the wafer.

Three or more transition supports 31 can be provided for supporting the susceptor 53 temporarily during the wafer loading and unloading process, as described in more detail below. In the illustrated embodiment, the transition supports 31 are connected to and extend from the ring 32. However, it will be understood that the supports 31 could extend from the chamber floor 29, the dividers 36 and 38 (especially in embodiments without the ring 32), or any other non-moving portion of the reactor 10. In the illustrated embodiment, the supports 31 are L-shaped. However, other shapes are possible, such as upright members attached to the chamber floor 29. For reasons that will be explained below, the top surfaces of the supports, which are adapted to support the susceptor 53, are below the lower surface of the susceptor when the susceptor is in the normal wafer processing position. The supports 31 should have sufficient rigidity and strength to provide stable support to the susceptor. Preferably, at least three supports 31 are provided. Preferably, three supports 31 are positioned about the periphery of the susceptor, spaced apart by angles of approximately 120° about the vertical center axis of the susceptor. The skilled artisan will appreciate that configurations having different numbers and locations of transition supports 31 are possible.

Figure 2:
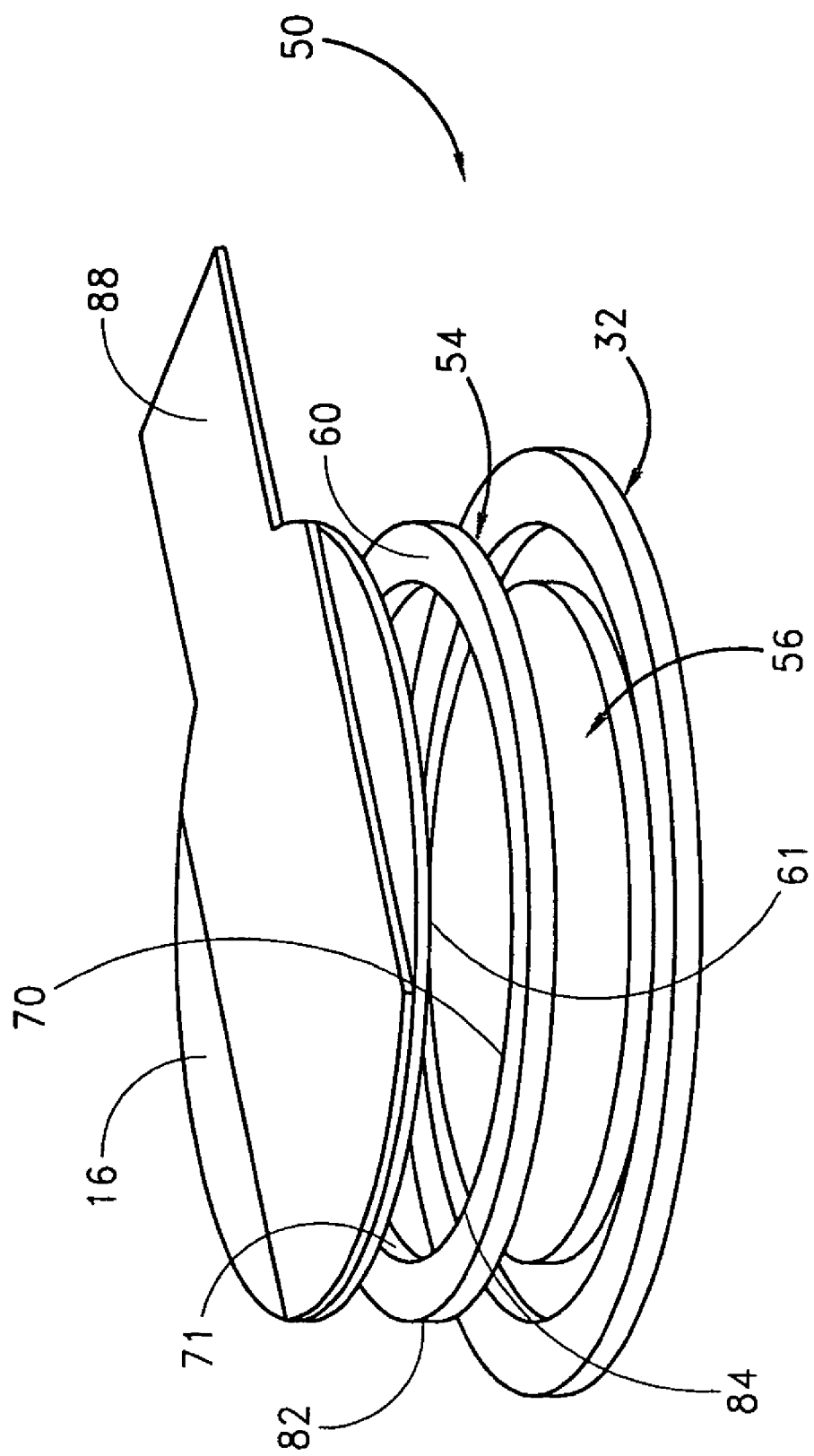
FIG. 2 is a perspective view of a susceptor according to one embodiment of the present invention, also showing a wafer and robot end effector.
Figure 3:
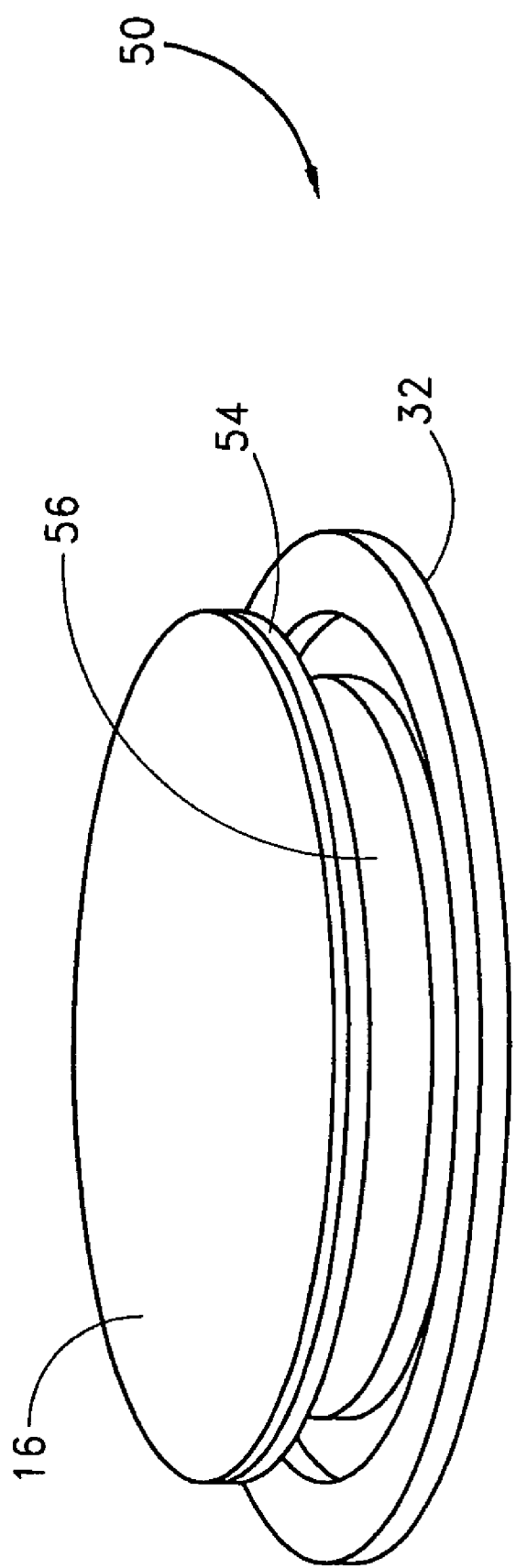
FIG. 3 is a perspective view of the susceptor of FIG. 1, after the wafer has been positioned onto the elevated lift ring.
Figure 4:
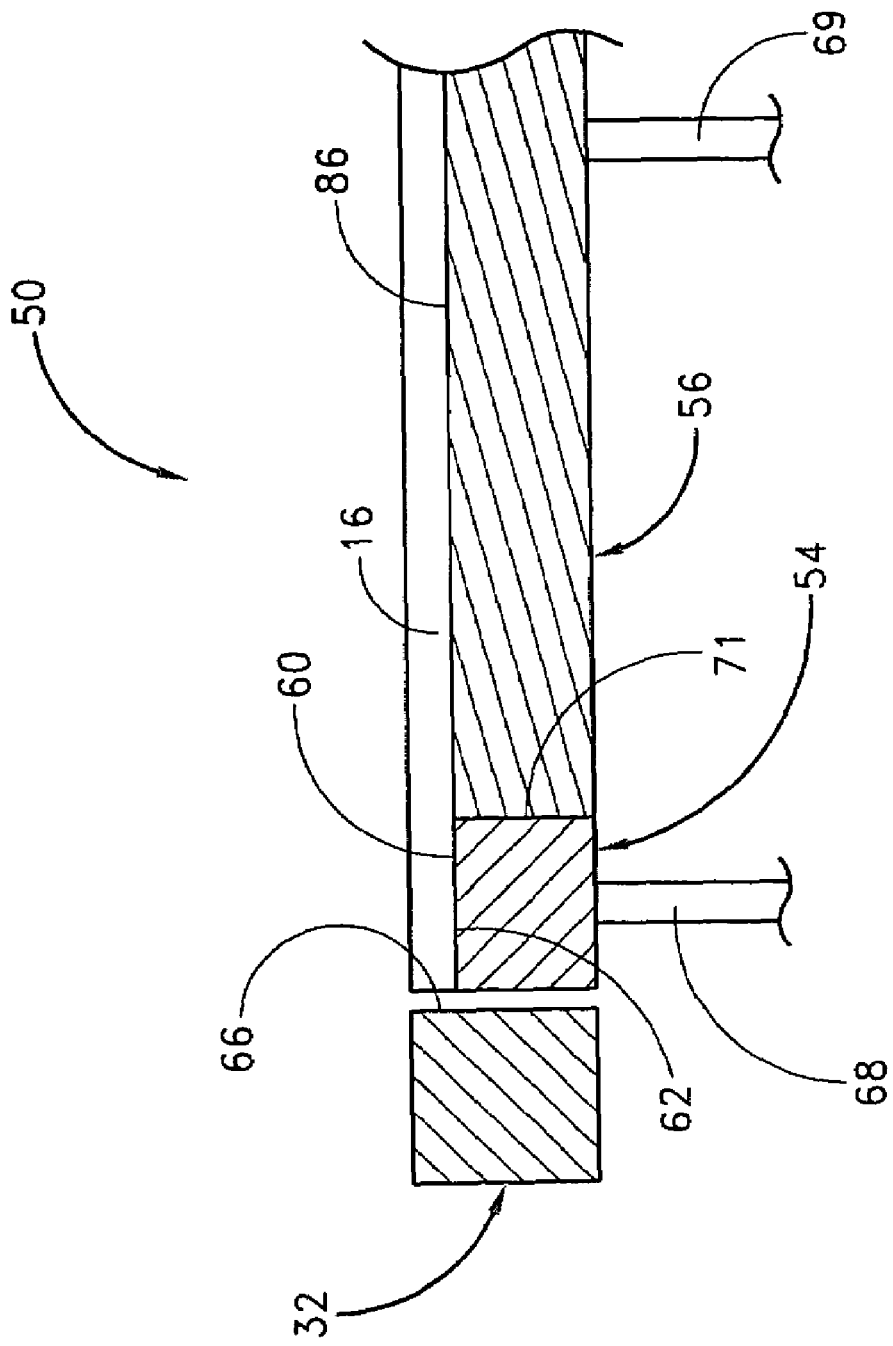
FIG. 4 is a cross-sectional view of one end of the susceptor of FIG. 1, with the lift ring in its lowered position.

FIGS. 2-4 show a susceptor 50 according to one embodiment of the present invention. The susceptor 50 comprises an outer ring 32 (also shown in FIG. 1), a lift ring 54, and an inner plug 56. The susceptor is configured to support a wafer 16. In the illustrated embodiment, the wafer 16 is circular. However, wafers of other shapes are possible. The lift ring 54 has a central aperture 70 defining a radial inner surface 71. The illustrated inner plug 56 is generally planar and disk-shaped and has outer radial dimensions configured to fit closely within the inner dimensions of the aperture 70 of the lift ring 54. The lift ring 54 has an upper wafer support surface 60 configured to support the bottom outer peripheral surface 62 of the wafer 16, as shown in FIG. 4. In the illustrated embodiment, the surface 60 is generally or substantially horizontal and flat. Preferably, the outer radial dimensions of the lift ring 54 are coextensive with or larger than that of the wafer 16. While the outer ring 32 is shown with a circular outer periphery, it could have a square or rectangular outer periphery. It has been determined that a square outer periphery of the ring 32 can improve the uniformity of deposited films.

Preferably, the lift ring 54 (as well as lift rings according to other embodiments of the invention) forms a complete and unbroken encircling portion that defines the central aperture 70. An unbroken formation has greater hoop strength and thus provides greater stability and less deformation during wafer processing, especially during processes with wide temperature fluctuations. The encircling portion may form a circle. A "perfect" circle, while preferred, is not required. A generally circular or even non-circular shape is acceptable.

The lift ring 54 is preferably moveable vertically between an elevated position shown in FIGS. 2 and 3 and a lowered position shown in FIG. 4. In the lowered position, the lift ring 54 is positioned within the outer ring 32. The outer ring 32 includes an inner, annular vertical wall 66 (see FIG. 4) that surrounds the lift ring 54 and the wafer 16 when the lift ring is lowered and is supporting the wafer. In particular, the wall 66 is positioned radially exterior of the lift ring 54 when the lift ring is in its lowered position. When the lift ring 54 is in its lowered position, the upper wafer support surface 60 is preferably coplanar with an upper surface 86 of the inner plug 56, together forming a flat surface that supports the wafer 16. Alternatively, when the lift ring 54 is in its lowered position, the surface 60 can be lower than or even slightly higher than the surface 86.

Alternatively, the upper surface 86 of the inner plug 56 and/or the upper surface 60 of the lift ring 54 can have a gridded configuration, comprising a plurality of intersecting grooves. A grooves reduce wafer "slide" (undesired sideward movement) when the wafer is loaded onto the susceptor. They also reduce wafer "stick" (undesired adherence) when the wafer is removed from the susceptor. The grooves provide a volume between the wafer and the susceptor, within which gas may flow to reduce slide and stick. This volume facilitates easier removal of the wafer from the susceptor, as suction forces therebetween are substantially limited by the grooves. Also, the inner plug and/or lift ring can have a slightly concave configuration, if desired, which provides even greater volume between the wafer and the susceptor.

In a preferred embodiment, the lift ring and inner plug do not include grid grooves, or grooves of any configuration. While in most susceptors grooves generally reduce wafer slide and stick, the illustrated lift rings of the present invention substantially reduce these problems in and of themselves. Wafer stick is overcome by lifting the wafer by its periphery off of the inner plug. Wafer slide is overcome because the lift ring prevents sideward movement of the wafer. Moreover, a non-grooved configuration prevents backside deposition at both higher and lower processing temperatures. In contrast, susceptors with grooves are generally used only with low temperature processes, because higher temperatures cause gas flow into the grooves and deposition on the wafer backside.

With continued reference to FIG. 4, a lift device 68 is provided for vertically moving the lift ring 54 between its elevated and lowered positions. In the illustrated embodiment, the lift device comprises one or more vertical support elements having upper ends supporting a lower surface of the lift ring. The skilled artisan will appreciate that any of a variety of lift devices can be provided, giving due consideration to the goals of ease of vertical movement of the lift ring 54, stability under high temperatures, and simplicity.

It may also be desirable to adjust the vertical position of the inner plug 56 to facilitate alignment of the upper surface 86 thereof with the upper wafer support surface 60 of the lift ring 54. Accordingly, another lift device 69 may be provided for vertically moving the inner plug 56. The skilled artisan will appreciate that any of a variety of lift devices can be provided, giving due consideration to the goals of ease of vertical movement of the inner plug 56, stability under high temperatures, and simplicity. In an alternative embodiment, the inner plug 56 may be supported such that it is vertically non-moveable with respect to the reaction chamber. For example, the inner plug 56 can be supported by a post or pedestal that is vertically fixed with respect to the lower floor of the reactor. Preferably, the inner plug 56 is rotatable about a vertical center axis.

The lift devices 68 and 69 are represented in FIG. 4 but not in FIGS. 1-3. In an alternative embodiment, the support spider 22 acts as a single lift device for supporting both the inner plug and the lift ring. The spider 22 can act as one or both of the lift devices 68 and 69. A spider according to this alternative embodiment is described below with respect to the susceptor embodiment of FIGS. 8-12 and 14-17.

In a preferred embodiment, the susceptor of the invention is rotatable. Preferably, at least both the lift ring and the inner plug are rotatable together about a vertical axis passing through the center of the susceptor. Rotation of the susceptor advantageously results in a generally more uniform deposition layer. In some embodiments, the inner plug and the lift ring can be engaged in a manner such that they cannot rotate with respect to one another, but can both rotate together with respect to the reaction chamber. In one configuration, the inner radial surface of the lift ring and the outer radial surface of the inner plug are engaged in a manner that prevents relative rotation of the lift ring and the inner plug, such as a splined engagement. For example, one of such surfaces can be provided with one or more vertical grooves at several circumferential positions, and the other of such surfaces can be provided with one or more vertical tongues or keys that slide within the grooves. When the lift ring is raised with respect to the inner plug, the tongues or keys slide out of the grooves. When the lift ring is lowered, the tongues or keys slide back into the grooves. A susceptor having a lift ring and inner plug with interconnecting or rotation-locking features is described below with respect to the embodiment of FIGS. 8-12 and 14-17.

With continued reference to FIGS. 2-4, the susceptor 50 of the illustrated embodiment solves the above-mentioned problems associated with thermal shock. In particular, the susceptor 50 permits a wafer 16 to be inserted into a pre-heated reaction chamber without any substantial risk of wafer curl or damage to the backside of the wafer. In use, the lift ring 54 is moved to its elevated position, as shown in FIG. 2. A wafer 16 is positioned above the lift ring 54 by any suitable means. For example, FIG. 2 shows the wafer positioned above the lift ring 54 by means of a Bernoulli wand 88. The wafer 16 is then set upon the upper wafer support surface 60 of the lift ring 54, as shown in FIG. 3. Preferably, the lift ring 54 is configured so that it contacts the wafer 16 only within the exclusion zone thereof. The exclusion zone is an outer peripheral portion of the wafer, in which little or no devices are formed. Damage to the backside of the wafer 16 caused by scratching or otherwise is not problematic if limited to within the exclusion zone. Further, by supporting the periphery of the wafer 16 with a flat or symetrically beveled (i.e., such as the susceptor 57 of FIG. 5) upper wafer support surface 60, the lift ring 54 greatly reduces the risk of scratching the backside of the wafer, as compared to susceptors having lift pins. The lift ring 54 does not have any sharp points of contact with the wafer, and is configured to provide a larger surface area of contact therebetween. These features reduce the likelihood of scratching and crystallographic slip.

The lift ring 54 and wafer 16 can be maintained in the position shown in FIG. 3 for a selected period of time to permit the wafer temperature to rise toward the temperature of the susceptor. In the elevated position, the wafer 16 receives several forms of heat, including (1) radiation from the susceptor and from the heating elements 14 shown in FIG. 1, (2) conduction from the lift ring 54, and possibly (3) convection by warm air in the reaction chamber. To completely prevent thermal shock, it may be desirable to permit the wafer temperature to achieve steady state, i.e., to gradually rise to the temperature of the susceptor. This is generally suitable when the susceptor has a lower temperature, such as less than 200° C. Alternatively, the wafer processing time can be reduced (and throughput thereby increased) by maintaining the lift ring 54 in its elevated position for a shorter duration. In that case, the wafer temperature rises to a level less than that of the susceptor but high enough to substantially reduce or prevent thermal shock when the wafer 16 is eventually lowered onto the inner plug 56. A suitable target temperature for the wafer depends upon the specific configuration and material characteristics thereof. Eventually, the lift ring 54 is lowered to the position shown in FIG. 4, so that the wafer 16 is in contact with the inner plug 56. Wafer processing desirably occurs when the wafer is in this position. It may be desirable to control the rate of descent of the wafer 16 toward the inner plug 56, so that the wafer temperature does not increase too suddenly.

The susceptor of the preferred embodiments, which includes a lift ring, can result in higher throughput while greatly reducing the risk of thermal shock. For example, compare a conventional susceptor (i.e., without lift pins or a lift ring) to one having a lift ring according to the present invention. In either case, when the processing of a first wafer is completed, the first wafer is removed from the reaction chamber and a second "cold" wafer is then loaded. In the case of the conventional susceptor, the second wafer is loaded immediately in direct contact with a surface of the susceptor. Heat conduction immediately occurs between the susceptor and the wafer. To reduce the risk of thermal shock to the wafer, the temperature of the conventional susceptor must be lowered somewhat, although this is rarely done in practice. The time associated with lowering the temperature of the susceptor adversely affects throughput. Hence, a higher degree of wafer curl, pop, or slip is often tolerated.

In contrast, with a susceptor according to the preferred embodiments of the present invention, the risk of thermal shock is substantially reduced. Moreover, it is not necessary to decrease the temperature of the susceptor before inserting a new "cold" wafer. After a first wafer is processed and removed, a second wafer can be loaded onto the lift ring in its elevated position. In this position, the temperature of the second wafer can be permitted to gradually increase before the wafer is lowered into direct contact with the surface of the inner plug. Thus, it is not necessary to decrease the temperature of the susceptor because the wafer experiences heat conduction only at its outer edges, from the lift ring. The reduction and localization of heat conduction at the outer edges of the wafer can substantially reduce and even prevent thermal shock. Even if it is desirable to decrease the temperature of the susceptor to some extent, it will not be necessary to decrease the temperature of the susceptor to the same extent necessary in the case of the conventional susceptor. The time during which the wafer is elevated above the inner plug is expected to be significantly less than the time associated with lowering the temperature of the conventional susceptor. For example, in methods in which the wafer is preheated by being held within the reaction chamber by a robotic end-effector, preheat times are generally about 3.5 seconds. The preheat time of the present invention is expected to be much lower, as low as 0.5 seconds. Thus, susceptors according to the present invention reduce thermal shock and improve throughput.

In a preferred embodiment of the invention, the temperature of the reaction chamber is continually maintained above the temperature at which nitrides are formed. The lift ring of the invention helps to reduce thermal shock to the wafers at such higher temperatures.

Figure 5:
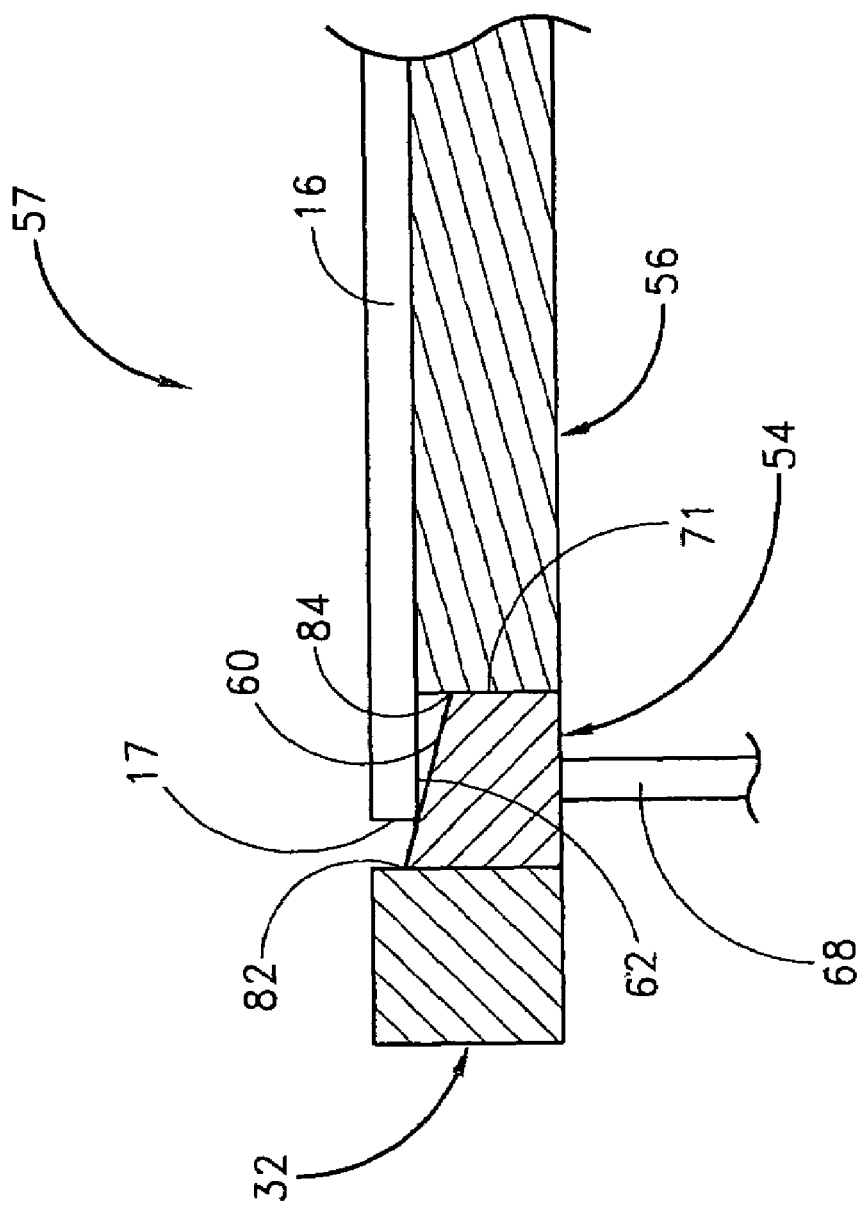
FIG. 5 is a cross-sectional view of one end of a susceptor according to another embodiment of the present invention.

FIG. 5 illustrates a susceptor 57 according to an alternative embodiment of the present invention, in which the upper wafer support surface 60 of the lift ring 54 is beveled so that its outer radial edge 82 is slightly higher than its inner radial edge 84. This configuration tends to ensure that the lift ring 54 only contacts the wafer 16 at its outer edge 17. Advantageously, the contact between the wafer 16 and the lift ring 54 is minimized and limited to within the exclusion zone of the wafer. Those of ordinary skill in the art will understand that many of the embodiments of susceptors taught herein can be provided with a lift ring having a beveled upper wafer support surface.

Figure 6:
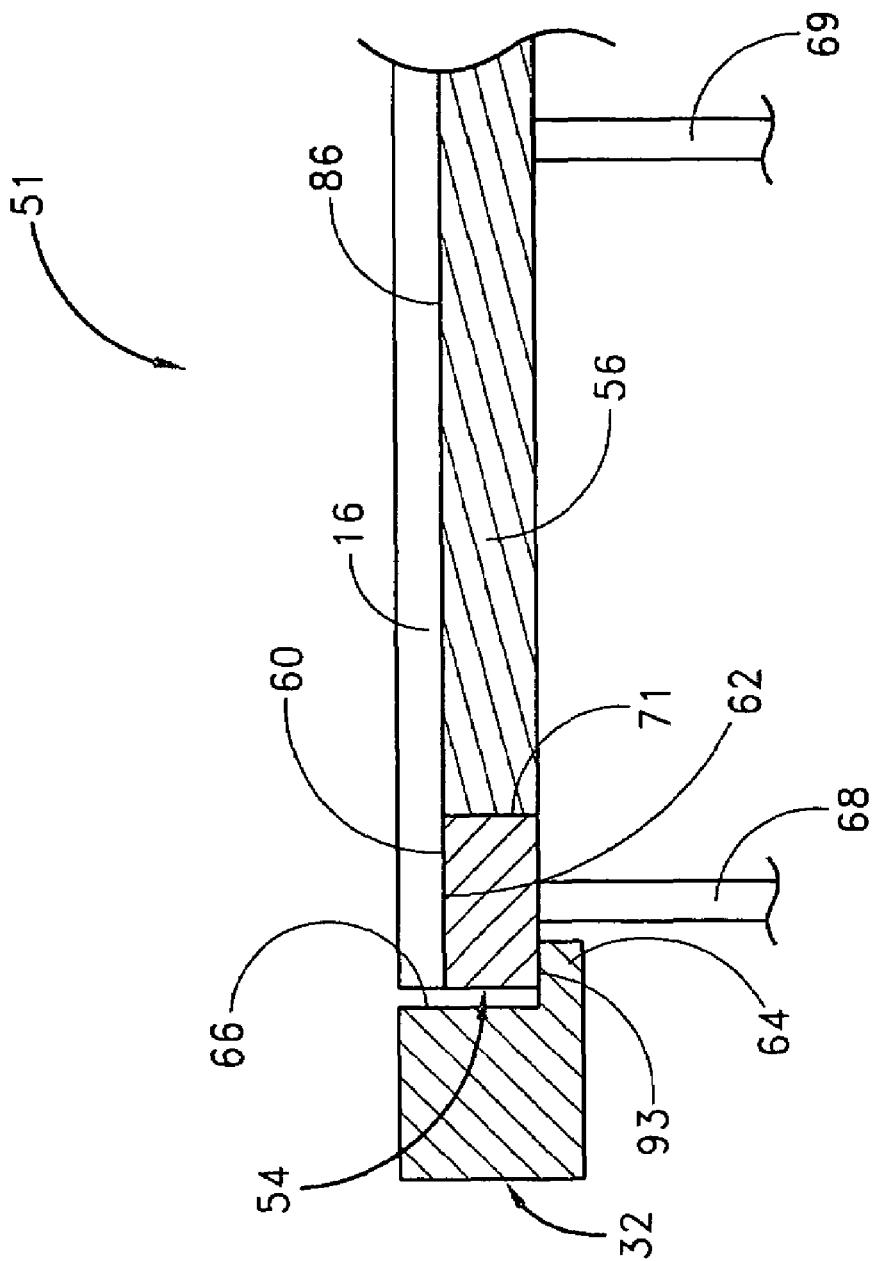
FIG. 6 is a cross-sectional view of one end of a susceptor according to another embodiment of the present invention.

FIG. 6 illustrates a susceptor 51 according to another embodiment of the present invention. In this embodiment, the susceptor 51 includes an annular ledge 64 on the inner radial surface of the outer ring 32. A lower surface 93 of the lift ring 54 is configured to rest upon the ledge 64 when the lift ring is in its lowered position. The ledge 64 may be formed integrally with the outer ring 32. Alternatively, the ledge 64 may be formed separately and secured onto the outer ring 32. The lift device 68 is secured to the lift ring 54 and positioned radially inward of the ledge 64.

Figure 7:
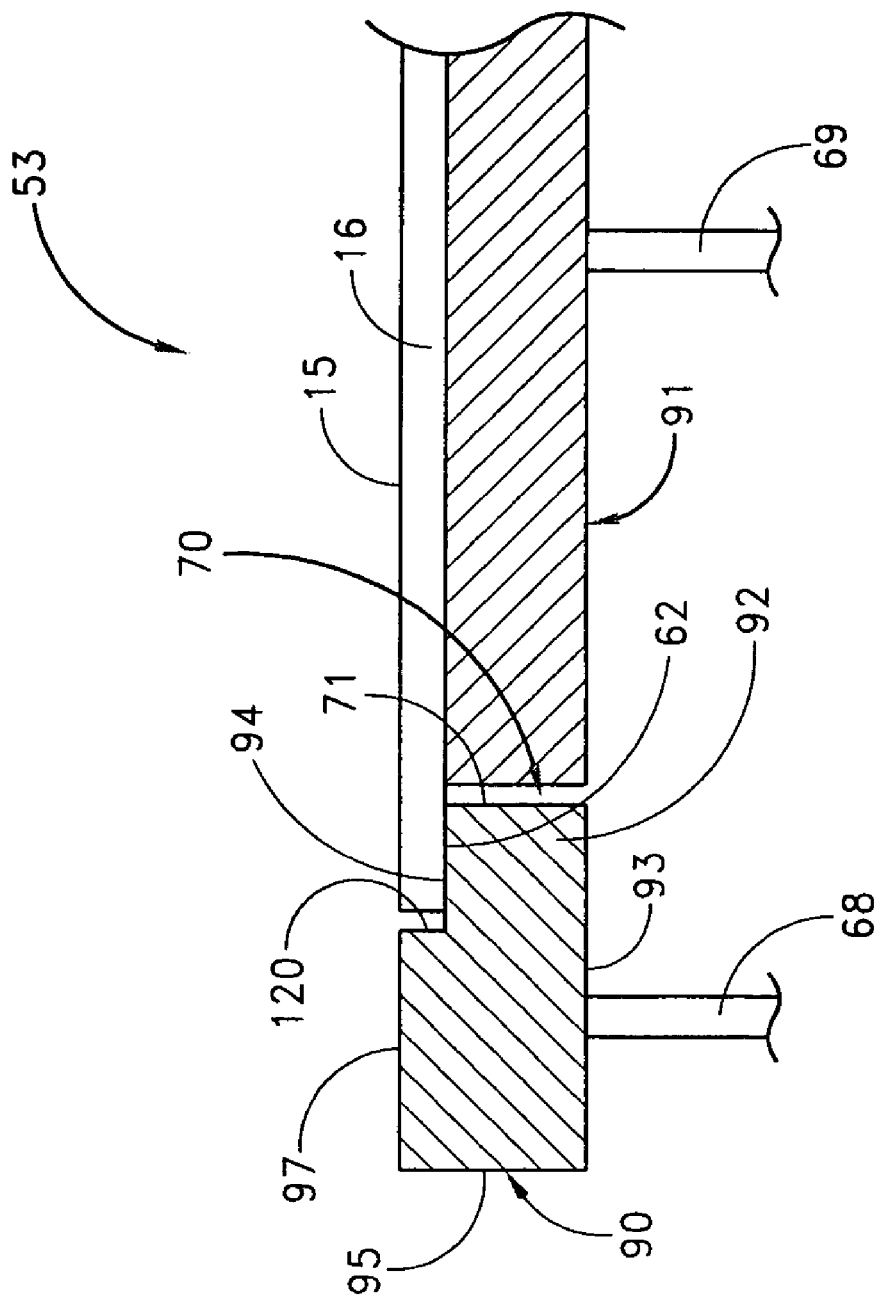
FIG. 7 is a cross-sectional view of one end of a susceptor according to yet another embodiment of the present invention.
Figure 8:
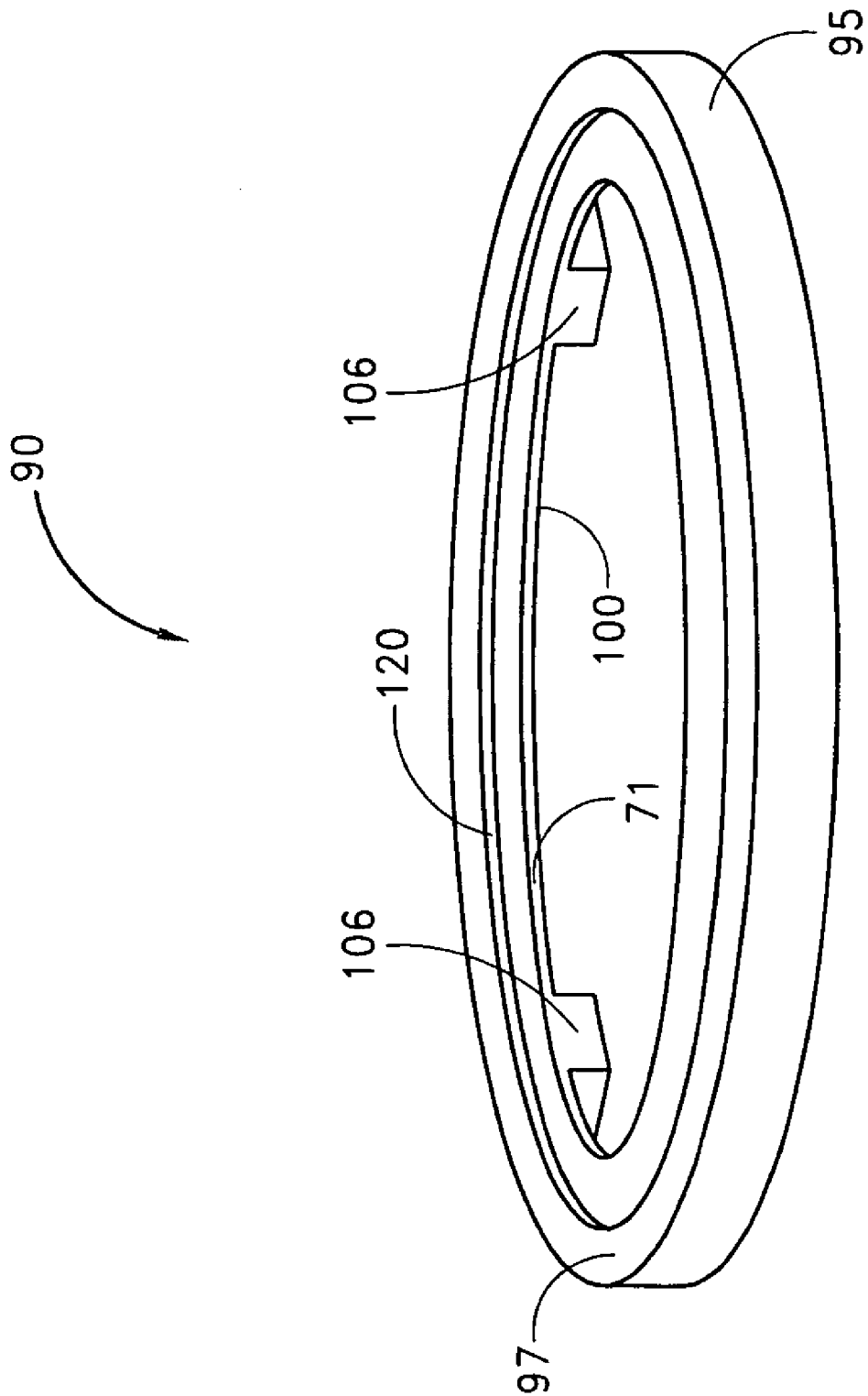
FIG. 8 is a top perspective view of a lift ring of a susceptor according to another embodiment of the present invention.
Figure 9:
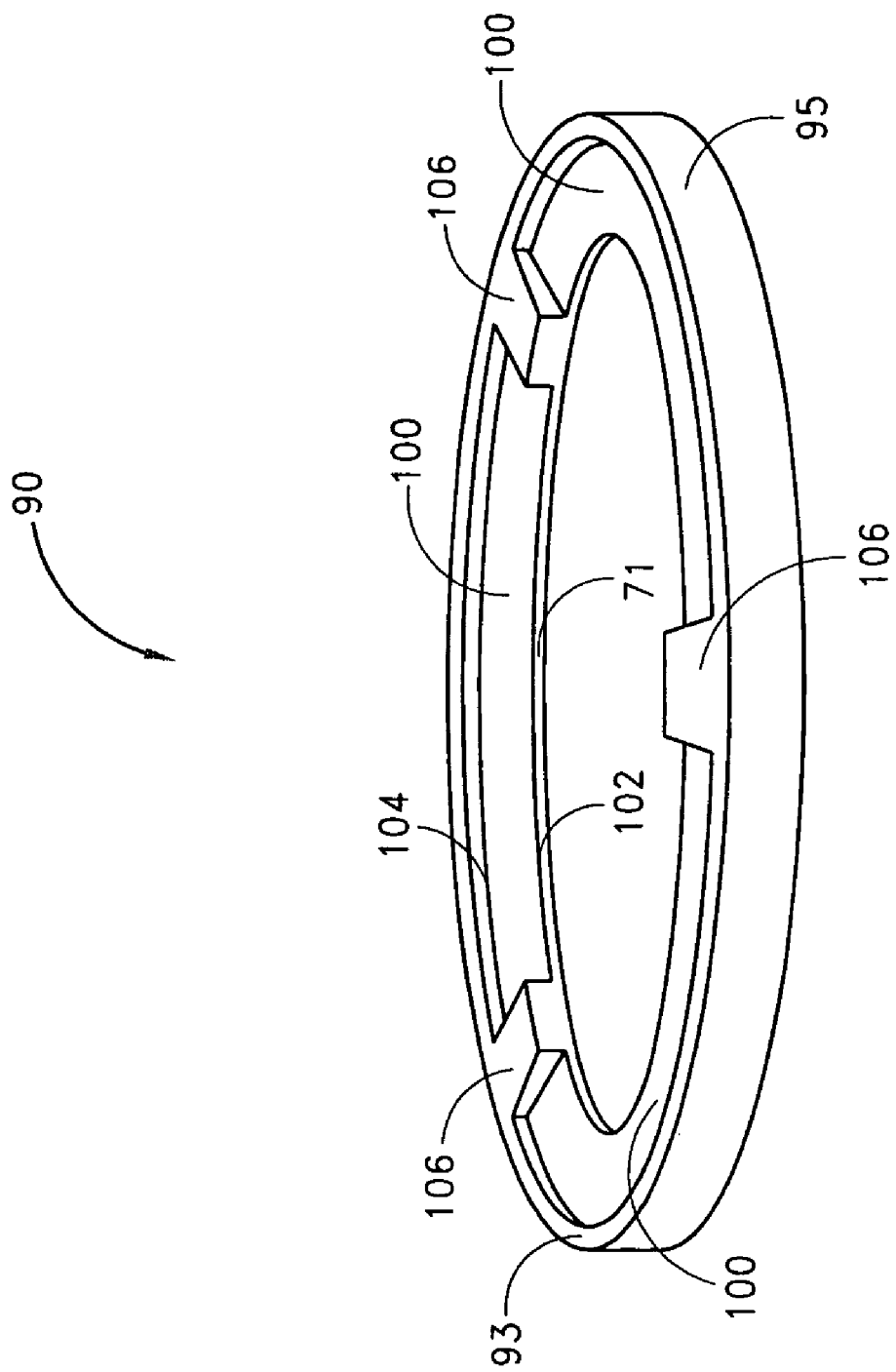
FIG. 9 is a bottom perspective view of the lift ring of the susceptor of FIG. 8.

FIG. 7 illustrates a susceptor 53 according to another embodiment of the present invention. In this embodiment, the susceptor 53 includes a lift ring 90 and an inner plug 91. The susceptor 53 does not include a separate outer ring, such as the outer ring 32 illustrated in FIGS. 2-4 and 6. The lift ring 90 has an upper surface 97 and an annular inner ledge 92 formed by an annular step 120. The ledge 92 has an upper wafer support surface 94 configured to support the bottom outer peripheral surface 62 of the wafer 16. When the wafer 16 is supported on the surface 94 of the ledge 92, the upper surface 97 of the lift ring 90 and the upper surface 15 of the wafer can be substantially coplanar. In one embodiment, the upper surface 94 is generally or substantially flat. However, the surface 94 can also be beveled, as described above with reference to FIG. 5. In some embodiments, the surface 94 contacts the wafer 16 only within the exclusion zone thereof. In some embodiments, the ledge 92 is circular.

The lift ring 90 has a lower surface 93, an outer radial surface 95, and an inner radial surface 71 defined by the aperture 70 of the lift ring. The lift ring 90 is vertically moveable in the same manner as the lift ring 54 described above. A lift device 68 can be provided for vertically moving the lift ring 90 between its elevated and lowered positions, as described above. The inner plug 91 may be supported so that it is vertically non-moveable with respect to the reaction chamber. Alternatively, another lift device 69 can be provided for adjusting the vertical position of the inner plug 91. Preferably, the inner plug is rotatable about a vertical center axis.

Figure 11:
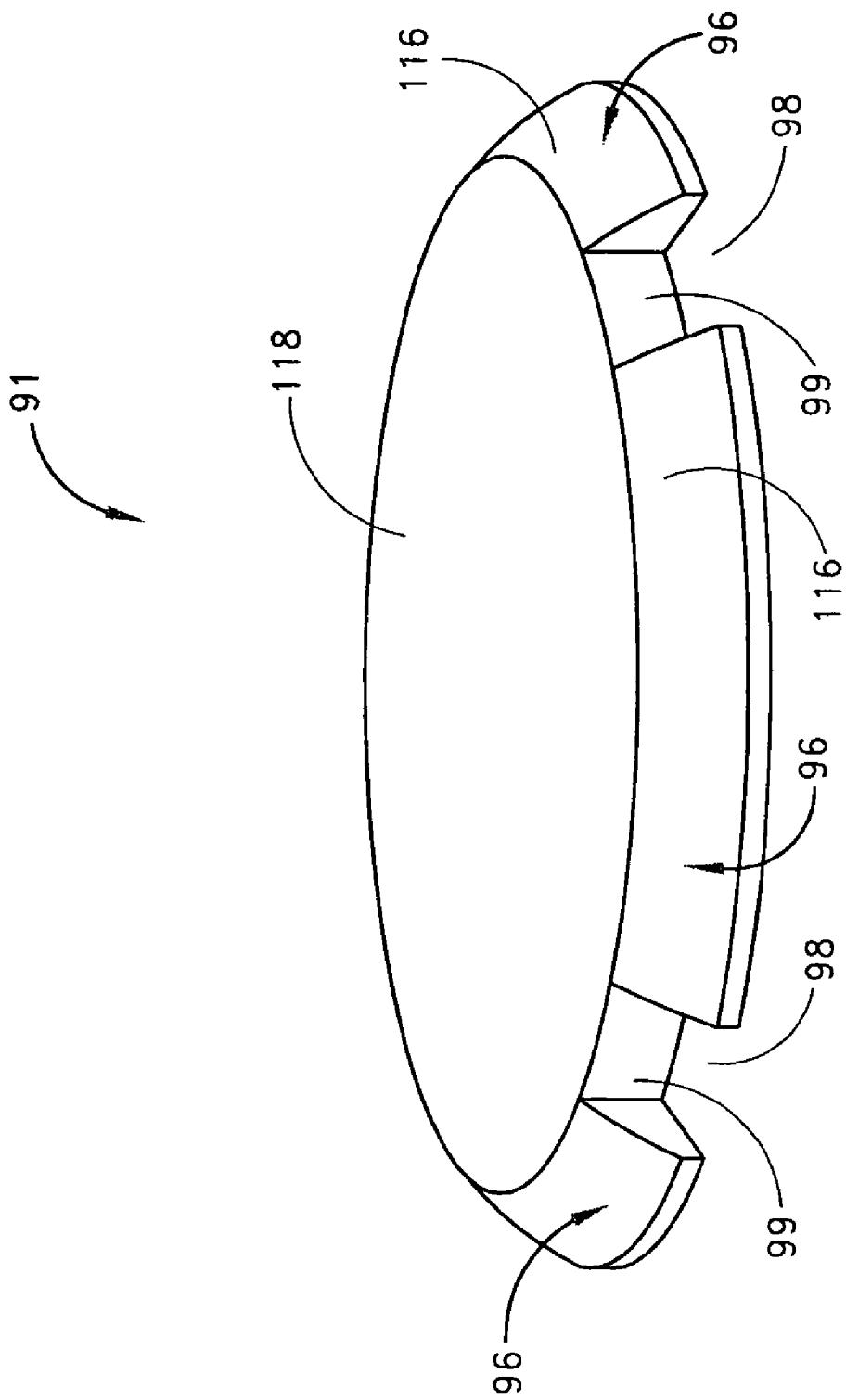
FIG. 11 is a perspective view of an inner plug for use with the lift ring of FIG. 8.
Figure 12:
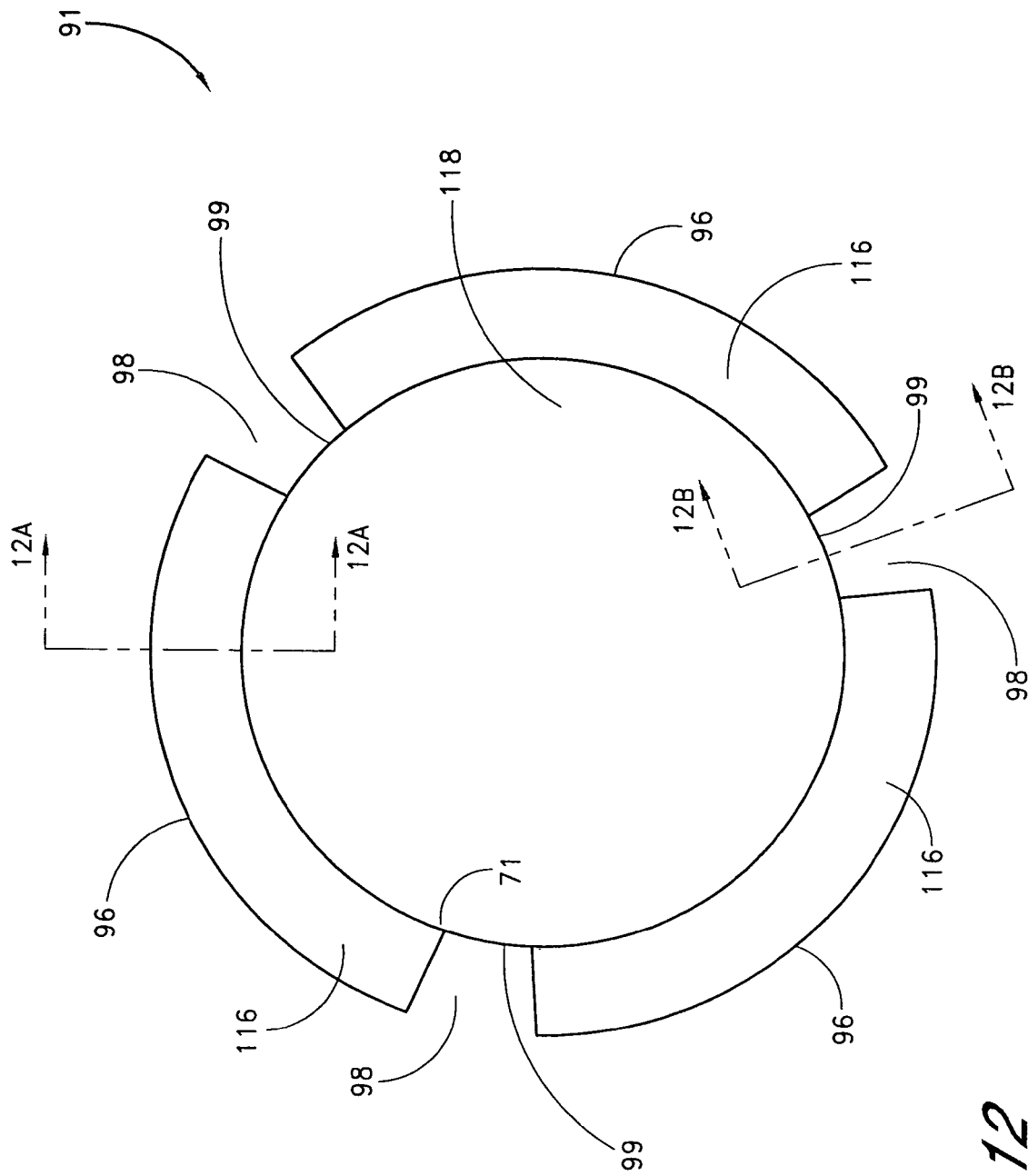
FIG. 12 is a top view of the inner plug of the inner plug of FIG. 11.
Figure 12B:
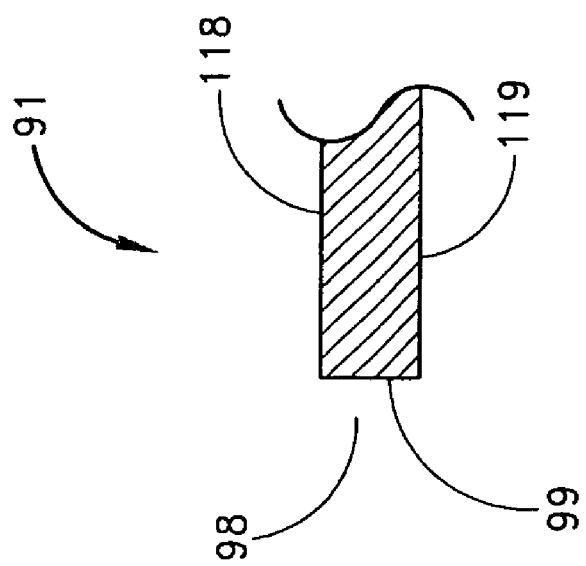
FIG. 12B is a sectional view of the inner plug, taken along line 12B-123B of FIG. 12.
Figure 12A:
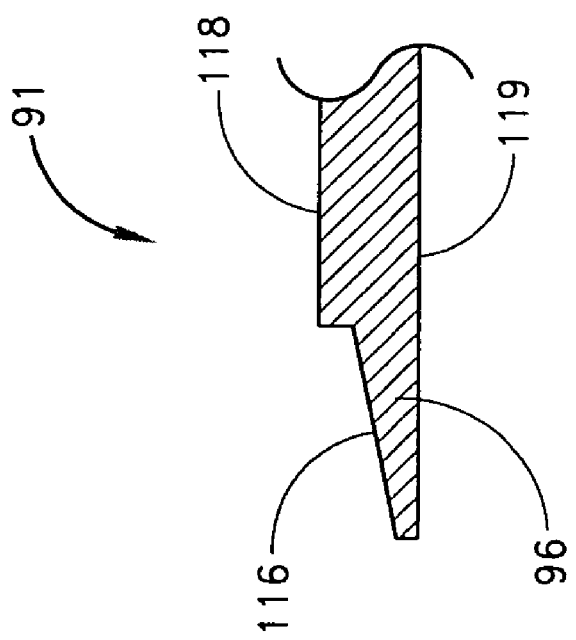
FIG. 12A is a sectional view of the inner plug, taken along line 12A-12A of FIG. 12.

FIGS. 8-12B illustrate an embodiment of the susceptor 53 of FIG. 7. In this embodiment, the susceptor is rotatable and also includes features that prevent relative rotation of the lift ring with respect to the inner plug. As shown in FIGS. 11 and 12, the outer edge of the inner plug 91 includes a plurality of circumferentially elongated lift ring support portions 96 that support the lift ring 90 (FIGS. 8-10B) when the lift ring is lowered to surround the inner plug. Each support portion 96 has an upper surface 116, at least a portion of which extends below the top central surface 118 of the inner plug 91. The upper surfaces 116 of the support portions 96 contact and support conforming surfaces of the lift ring when it is lowered into the wafer processing position. FIG. 12A illustrates a preferred embodiment of the lift ring support portions 96. In the embodiment of FIG. 12A, each portion 96 has a profile that slants generally downward and radially outward from the top surface 118 of the inner plug to the bottom surface 119. One advantage of this profile is that it promotes centering of the lift ring upon the inner plug. Preferably, the number of support portions 96 is equal to the number of arms 19 of the support spider 22 of the reaction chamber (FIG. 1), for reasons explained below. Preferably, three arms 19 and support portions 96 are provided. Recesses 108 (FIG. 15) may be provided in the bottom surface 119 of the inner plug for receiving upper ends of support members 21 of the support spider 22, for reasons explained below.

The lift ring support portions 96 of the inner plug 91 are separated by recesses 98. In the illustrated embodiment, as shown in FIG. 12B, the recesses 98 have a substantially vertical outer radial surface 99. The recesses 98 are sized and shaped to receive anti-rotation keys 106 (FIGS. 8-10B) of the lift ring 90, in order to prevent relative rotation of the lift ring and inner plug when the lift ring is lowered into the wafer processing position.

Figure 10:
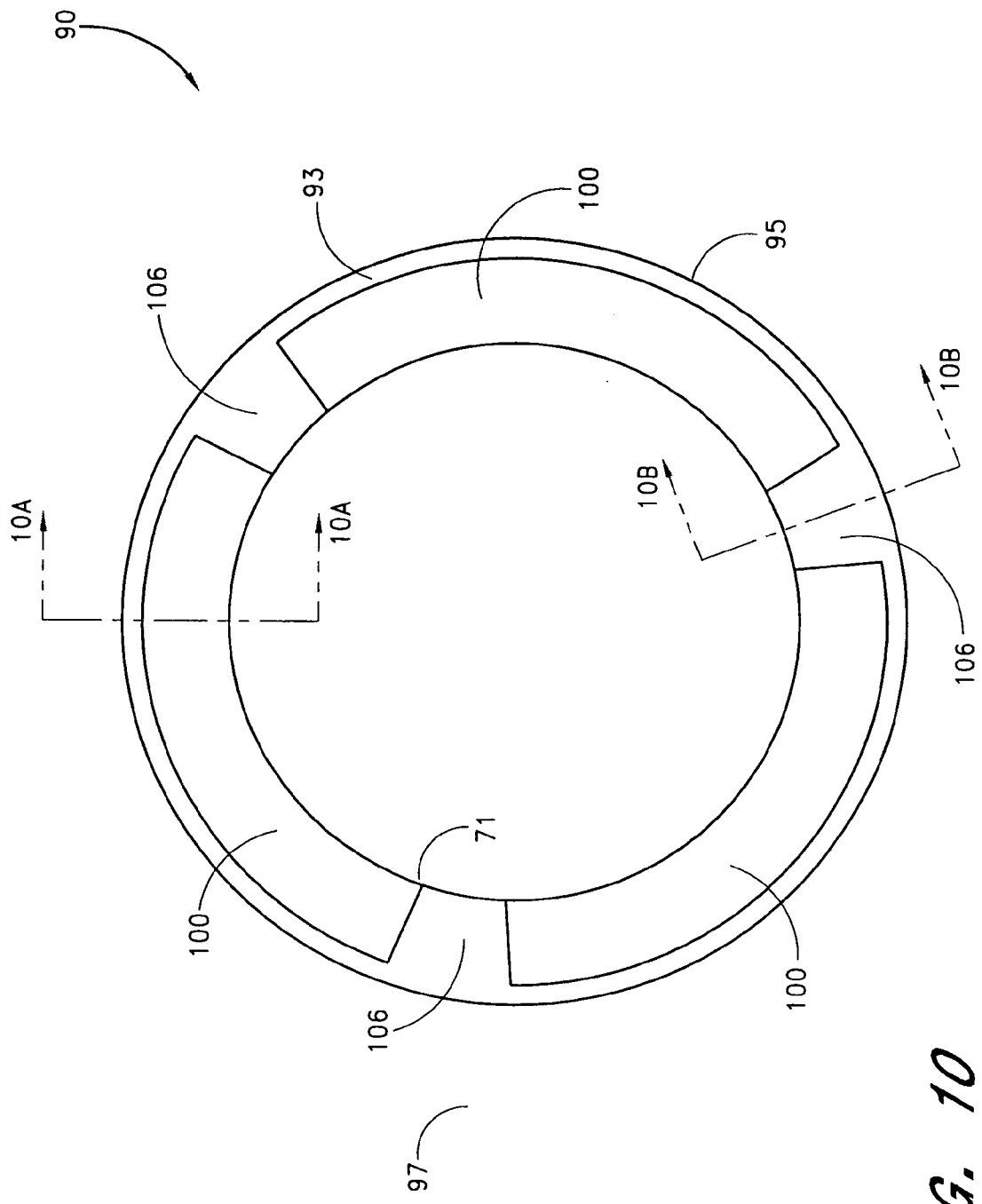
FIG. 10 is a bottom view of the lift ring of the susceptor of FIG. 8.
Figure 10B:
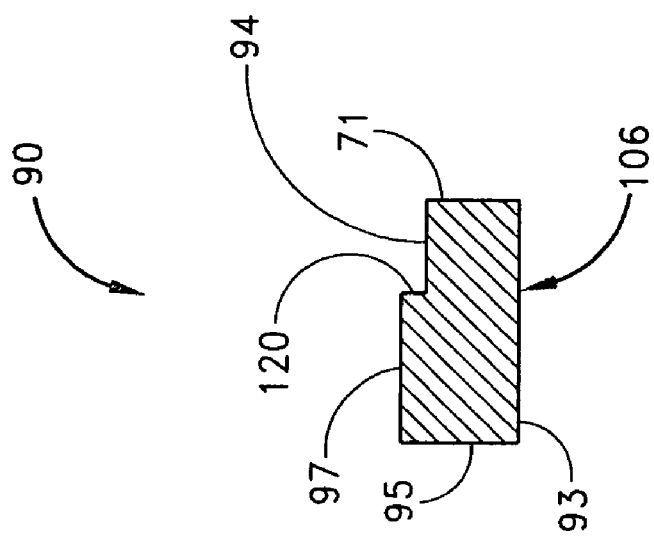
FIG. 10B is a sectional view of the lift ring, taken along line 10B-10B of FIG. 10.
Figure 10A:
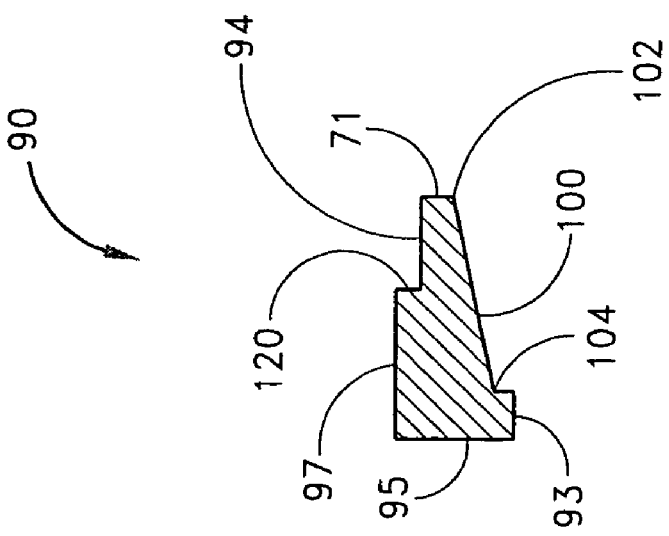
FIG. 10A is a sectional view of the lift ring, taken along line 10A-10A of FIG. 10.

As shown in FIGS. 8-10B, the lift ring 90 includes three circumferentially elongated lower recesses 100 on its inner radial surface 71, adjacent to the lower surface 93. As shown in FIG. 10A, the recesses 100 have a slanted profile. In particular, the recesses 100 slant downward and radially outward from a position 102 on the inner surface 71 near the upper surface 94 to a position 104 near the lower surface 93 and the outer radial surface 95. Provided between and separating the recesses 100 are three anti-rotation members or keys 106, having a profile shown in FIG. 10B. The three keys 106 are shaped and configured to closely fit within the recesses 98 of the inner plug 91. Likewise, the three recesses 100 of the lift ring 90 are shaped and configured to closely receive the three lift ring support portions 96 of the inner plug 91. The lift ring support portions 96 function to support the lift ring on the inner plug. The engagement of the portions 96 of the inner plug 91 within the recesses 100 of the lift ring 90, as well as the engagement of the keys 106 of the lift ring within the recesses 98 of the inner plug, prevent relative rotation of the lift ring with respect to the inner plug. Advantageously, when the lift ring is supported on the inner plug, the lift ring and the inner plug rotate in unison, which causes the wafer to rotate in a more stable manner and prevents scratching of the backside thereof.

The skilled artisan will appreciate that any number of anti-rotation features (such as, but not limited to, the support portions 96, recesses 98, recesses 100, and anti-rotation keys 106) can be provided on the lift ring and the inner plug of the susceptor, keeping in mind the goals of simplicity of design and preventing relative rotation of the lift ring and the inner plug. In the preferred embodiment, the inner plug and lift ring can include any number of sets of lift ring support portions 96, recesses 98, recesses 100, and anti-rotation keys 106. Also, the circumferential length of the portions 96, recesses 98, recesses 100, and keys 106 can be modified as desired. Anti-rotation features that are different from those described herein can be employed.

Figure 13:
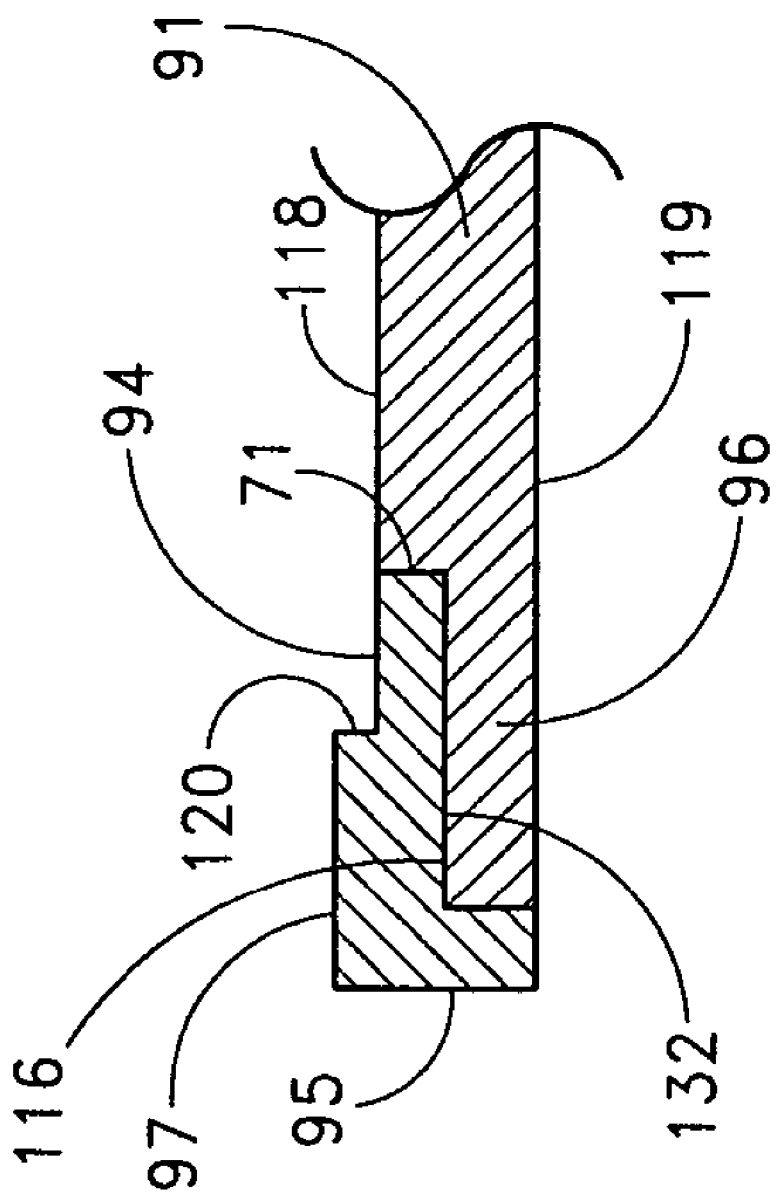
FIG. 13 is a sectional view of a lift ring and inner plug of a susceptor according to another embodiment of the present invention.

FIG. 13 illustrates an alternative embodiment of the support portions 96 of the inner plug 91 and the recesses 100 of the lift ring 90. In this embodiment, the upper surfaces 116 of the support portions 96 are substantially horizontal and flat. Likewise, the lower surfaces of the recesses 100 are substantially horizontal and flat, as illustrated by flat surface 132, and substantially conform to the shape of the support portions 96. Those of ordinary skill in the art will understand that many other configurations of the support portions 96, recesses 98, recesses 100, and anti-rotation keys 106 are possible and within the spirit and scope of the present invention.

FIGS. 14-17 illustrate an apparatus for supporting the susceptor 53 of FIGS. 8-12, as well as for raising the lift ring 90 to its elevated position above the inner plug 91. The support spider 22 (shown more completely in FIG. 1) provides support to the bottom of the inner plug 91. In particular, the susceptor support members 21 of the L-shaped support arms 19 of the spider 22 support the inner plug near its periphery, at a radial position in the region of the lift ring support portions 96. In the illustrated embodiment, the spider includes three arms 19, and the inner plug and lift ring include three sets of lift ring support portions 96, recesses 98, recesses 100, and anti-rotation keys 106. Preferably, several recesses 108 are provided in the lower surface of the inner plug for receiving the upper ends of the support members 21, so that rotation of the spider 22 and the shaft 24 (FIG. 1) causes rotation of the susceptor 53.

Figure 14:
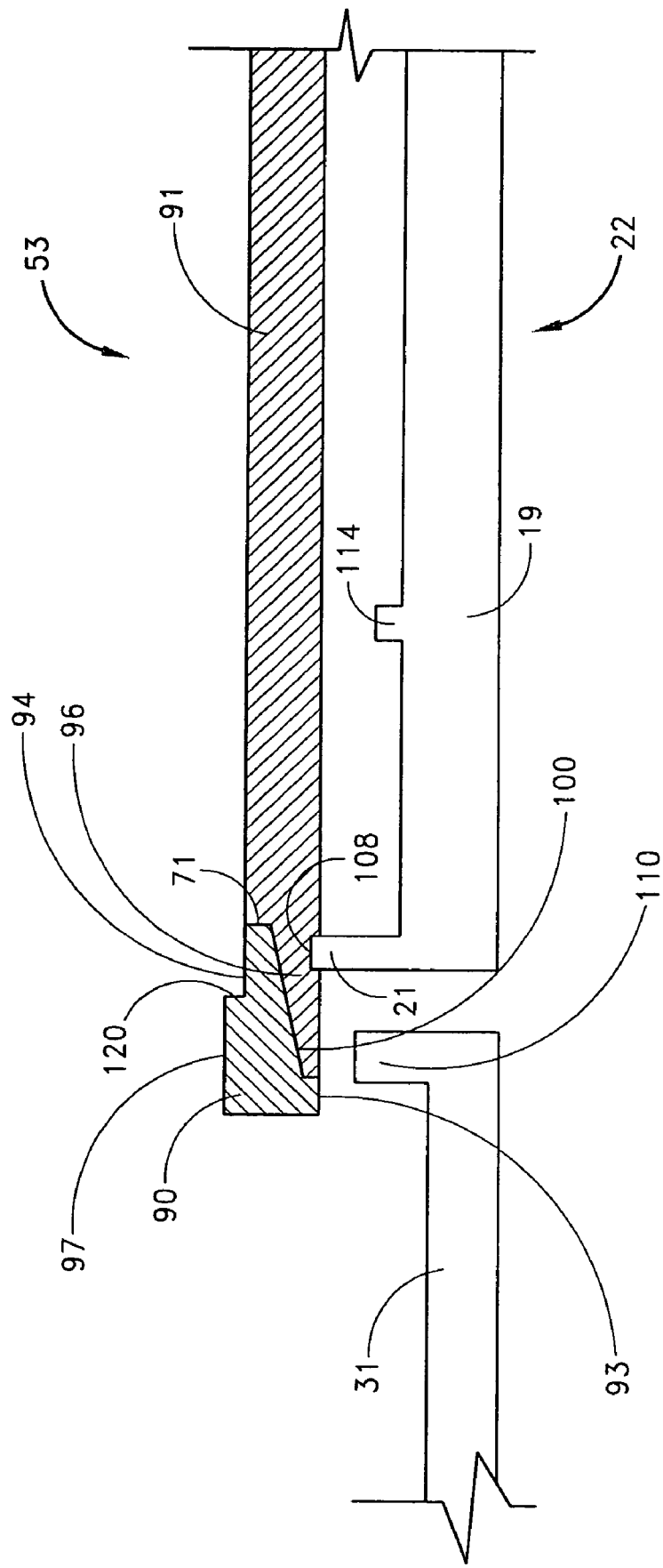
FIG. 14 is a partially sectional view of the susceptor of FIGS. 8 and 11 and one embodiment of a lift device, in which the lift ring is shown supported on the inner plug in the wafer processing position.
Figure 15:
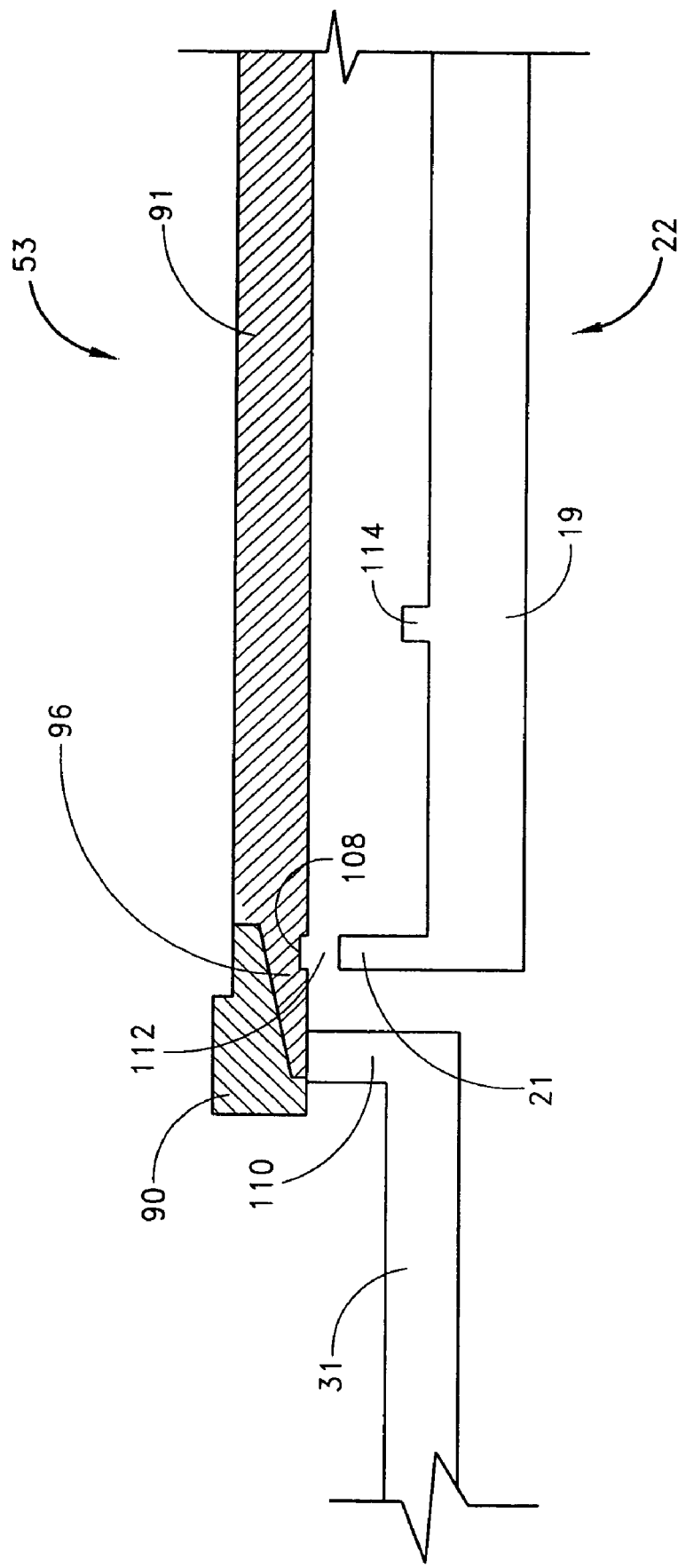
FIG. 15 is a partially sectional view of the susceptor and lift device of FIG. 14, in which the lift device has been lowered.

As explained above and shown in FIG. 1, a plurality of transition support members 31 are provided in the reactor 10. With reference to FIG. 14, the illustrated supports 31 are L-shaped and have vertical supporting ends 110 positioned below the inner plug 91 in the region of the lift ring support portions 96. When the susceptor 53 is in the wafer processing position, the upper surfaces of the supporting ends 110 are below the lower surface of the inner plug 91.

FIGS. 14-17 illustrate a method of loading a wafer 16 onto the susceptor 53. With the spider 22 and the susceptor 53 in the positions shown in FIG. 14, the spider 22 is lowered to a position such as that shown in FIG. 15. As the spider 22 is lowered, the lower surface of the inner plug 91 contacts the supporting ends 110 of the transition support members 31. The spider 22 is then lowered further until the susceptor support members 21 of the arms 19 slide out of the recesses 108 of the inner plug. A clearance 112 is formed between the upper surfaces of the support members 21 and the lower surface of the inner plug. At this point, the transition support members 31 support the susceptor 53.

Figure 16:
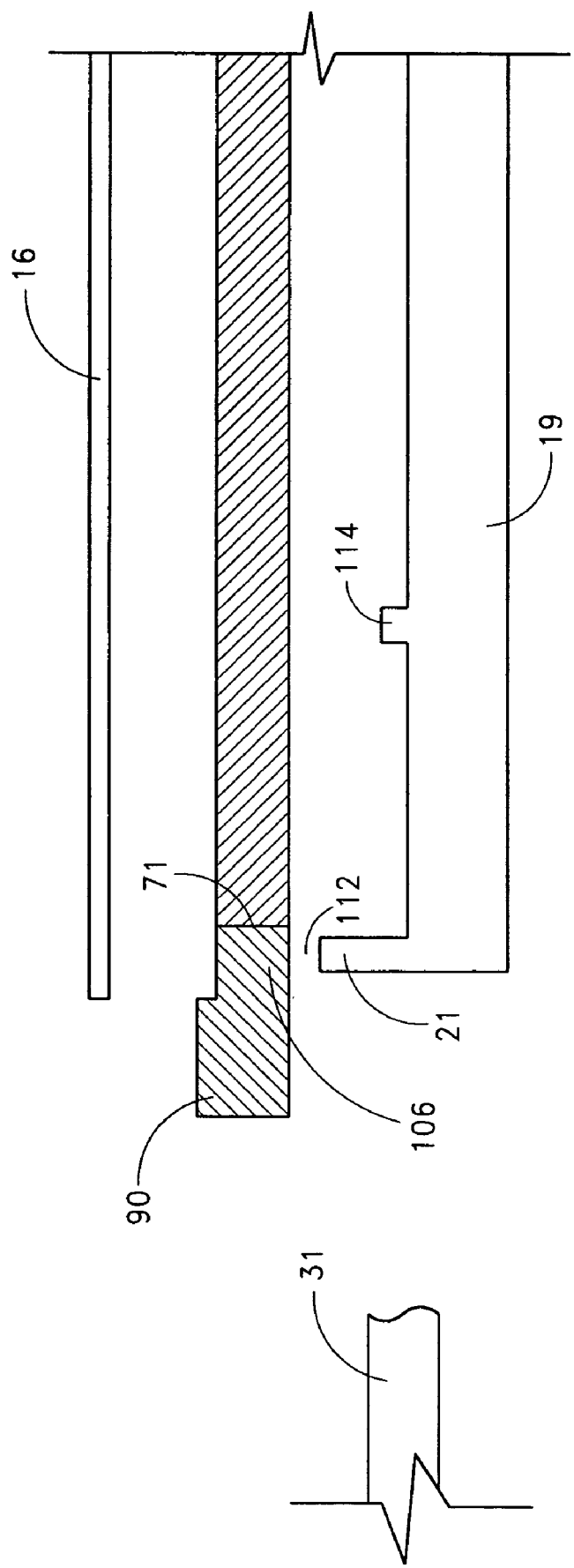
FIG. 16 is a partially sectional view of the susceptor and lift device of FIG. 14, in which the lift device has been rotated into a position to elevate the lift ring.

As shown in FIG. 16, the support spider 22 is then rotated until the support members 21 of the arms 19 are below the anti-rotation keys 106 of the lift ring 90. During the rotation of the spider 22, the transition support members 31 provide stable support to the inner plug 91 and lift ring 90. Due to the clearance 112, the spider 22 can be rotated without contacting the susceptor 53. A wafer 16 can be positioned above the susceptor 53 at this time, by means of a Bernoulli wand or other wafer loading apparatus. The skilled artisan will appreciate that the wafer 16 can be positioned above the susceptor 53 either before or after the spider 22 is rotated from the position shown in FIG. 15 to that shown in FIG. 16.

Figure 17:
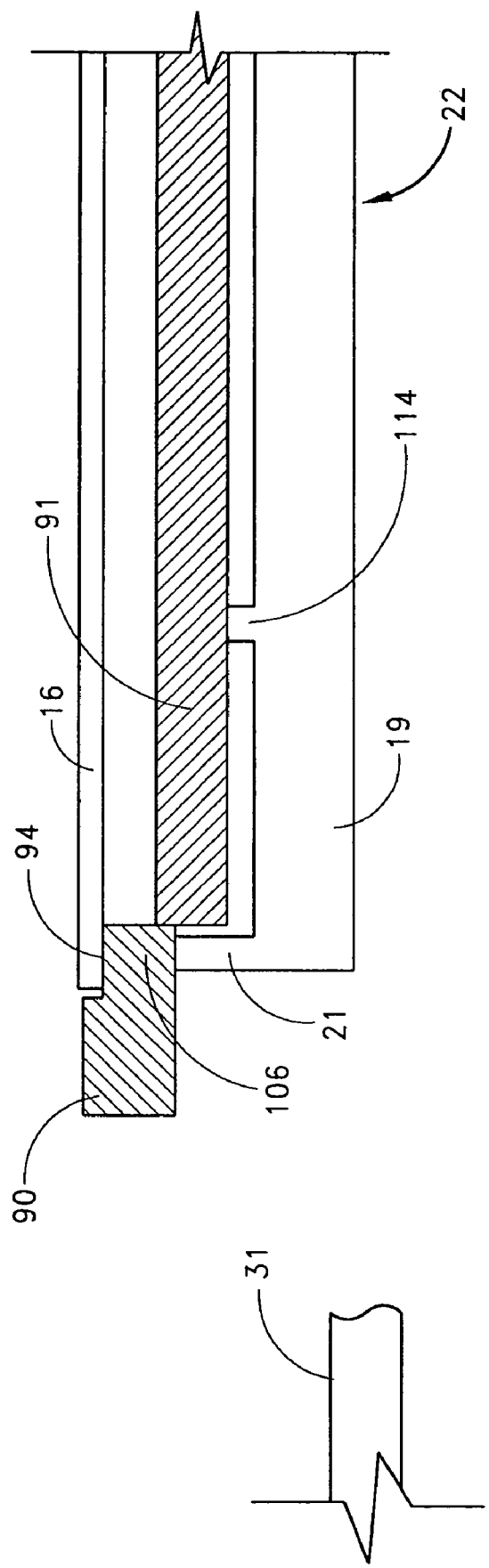
FIG. 17 is a partially sectional view of the susceptor and lift device of FIG. 14, in which the lift ring is moved to its elevated position relative to the inner plug.

As shown in FIG. 17, the support spider 22 and shaft 24 (FIG. 1) are then raised. The support members 21 of the arms 19 contact the lower surfaces of the anti-rotation keys 106 and raise the lift ring 90 above the inner plug 91. In this position, the lift ring support portions 96 of the inner plug 91 are positioned between the support members 21 of the spider 22. In the illustrated embodiment, the inner plug 91 remains supported by the transition support members 31 until the spider 22 is raised to a level such that intermediate support members 114 located on the support arms 19 contact the lower surface of the inner plug. As the spider 22 is raised beyond this position, the inner plug 91 is raised upon the support members 114. In an alternative configuration, the support members 21 can be sufficiently long to prevent any vertical movement of the inner plug 91 when the lift ring 90 is raised. With the lift ring 90 in the raised position, the wafer 16 is "dropped" such that the periphery of the wafer is supported by the support surface 94 of the lift ring. In this position, the temperature of the wafer 16 is permitted to rise gradually to a degree such that thermal shock is prevented when the lift ring is lowered and the wafer contacts the inner plug 91.

Once the temperature of the wafer 16 rises to a level sufficient to substantially prevent thermal shock or significantly reduce it to an acceptable level, the lift ring 90 is lowered back down from the position shown in FIG. 17 to that shown in FIG. 16. In this position, the transition support members 31 support the susceptor 53 and the wafer 16 rests upon the lift ring and the inner plug 91. Next, with the clearance 112 formed between the susceptor 53 and the spider support members 21, the spider 22 is rotated back to the position shown in FIG. 15. Finally, the spider is raised again to the position shown in FIG. 14, such that the upper ends of the support members 21 slide into the recesses 108 of the inner plug 91 and lift the susceptor 53 above the transition support members 31. This is the wafer processing position of the susceptor.

After the wafer 16 is processed, the wafer 16 can be removed in any desirable manner. In one method, the lift ring 90 is again raised by moving through the sequence of positions shown in FIGS. 14-17. When the lift ring and wafer are in the raised position, the wafer is removed by a wafer removal apparatus, such as a Bernoulli wand or other end effector.

With regard to all of the above-described embodiments, the lift ring preferably contacts the wafer 16 only within the exclusion zone thereof. The lift ring preferably contacts the wafer within a region extending preferably no more than 5 mm, more preferably no more than 3 mm, and even more preferably no more than 2 mm from the outer edge 17 of the wafer. This ensures that most of the heat conduction received by the wafer 16 is received from the inner plug 56 during processing. In the preferred embodiment, the wafer receives heat from both the lift ring and the inner plug. Preferably, the upper wafer support surfaces of the lift ring and the inner plug are aligned when the lift ring is in its lowered position, so that the wafer receives conductive heat transfer from both the lift ring and the inner plug. Alternatively, as mentioned above, the wafer support surface of the lift ring can be slightly above or slightly below that of the inner plug. As used herein, statements that the wafer support surfaces of the lift ring and the inner plug are "generally coplanar" or "generally at the same vertical position" should be interpreted to allow for a small vertical differential between such surfaces. Such vertical differential is preferably less than 1.0 mm and more preferably less than 0.5 mm.

The susceptor of the present invention can have a low thermal mass, such that the wafer temperature closely tracks that of the inner plug and lift ring during processing. Advantageously, a low thermal mass of the susceptor facilitates monitoring of the wafer temperature by monitoring the temperature of the inner plug and/or lift ring. Preferably, the thermal mass of the outer ring 32 is also low. In one embodiment, the thermal mass of the susceptor (including the inner plug, lift ring, and outer ring if included) is less than eight times the thermal mass of the wafer to be processed. The advantages of low mass susceptors are taught in U.S. Pat. No. 6,086,680 to Foster et al., the entire disclosure of which is hereby incorporated herein by reference.

The susceptors of the present invention can be formed of any of a variety of materials, including those typically used for making susceptors. Preferably, the susceptors, including the inner plugs, lift rings, and outer rings, are formed of graphite and coated with silicon carbide. Preferably, the lift ring and the inner plug are formed of the same material, so that differential temperatures and thermal expansion is substantially avoided.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Further, the various features of this invention can be used alone, or in combination with other features of this invention other than as expressly described above. Thus, it is intended that the scope of the present invention herein disclosed should not be limited by the particular disclosed embodiments described above, but should be determined only by a fair reading of the claims that follow.

We claim:

1. A method of loading a wafer into a processing chamber having a temperature higher than that of the wafer, comprising:

positioning a wafer onto a lift ring within a processing chamber such that a bottom outer peripheral surface of the wafer is supported by a substantially flat upper wafer support surface of the lift ring, the upper wafer support surface being a top surface of the lift ring, the lift ring forming a substantially closed ring, the lift ring having a central aperture configured so that only a peripheral portion of the wafer makes contact with the lift ring, wherein the contact between the peripheral portion of the wafer and the lift ring extends along an elongated portion of the circumference of the wafer;

lowering the lift ring into surrounding engagement with an inner plug having a top surface, so that the inner plug is positioned within the central aperture of the lift ring and so that the top surface of the inner plug and the upper wafer support surface of the lift ring are generally coplanar, at least one of said top surface and said upper wafer support surface supporting a bottom surface of the wafer; and rotating the lift ring and the inner plug together about a vertical axis.

2. The method of claim 1, wherein the top surface of the inner plug is substantially flat and horizontal.

3. The method of claim 1, further comprising moving the lift ring upward from the inner plug before the wafer is positioned on the lift ring.

4. The method of claim 1, further comprising, after the wafer is positioned onto the lift ring, maintaining the lift ring in a position elevated above the inner plug a distance such that the wafer does not contact the inner plug, for a time period sufficient to allow the temperature of the wafer to rise to a level sufficient to substantially prevent thermal shock to the wafer after the wafer is brought into contact with the inner plug.

5. A method of processing a wafer on a susceptor within a processing chamber, the susceptor comprising an inner plug and a lift ring, the inner plug having a top surface, the lift ring forming a substantially closed ring, the lift ring having an upper wafer support surface configured to support a bottom outer peripheral surface of a wafer, the lift ring having a central aperture positioned such that the lift ring makes contact with substantially only a peripheral portion of a wafer supported thereon, wherein the contact between the peripheral portion of the wafer and the lift ring extends along an elongated portion of the circumference of the wafer, the central aperture being sized and shaped to receive the inner plug, the lift ring having a lowered position in which the wafer support surface is generally at the same vertical position as the top surface of the inner plug, the lift ring having an elevated position in which the wafer support surface is above the top surface of the inner plug such that a wafer supported on the lift ring substantially does not contact the inner plug, the inner plug configured to support the lift ring when the lift ring is in the lowered position, the method comprising:

with the lift ring in the lowered position thereof, supporting the inner plug on a support spider having arms extending radially outward and upward to contact a bottom surface of the susceptor, the spider being vertically moveable and rotatable about a vertical axis;

lowering the spider to a position such that the inner plug becomes supported on transition support members of the processing chamber, the lift ring remaining supported on the inner plug;

rotating the spider such that the arms are underneath and positioned to contact portions of the lift ring but not the inner plug if the spider is elevated;

elevating the spider such that the lift ring moves to the elevated position thereof;

loading a wafer onto the lift ring in the elevated position thereof;

permitting the temperature of the wafer to increase to a level sufficient to substantially minimize thermal shock to the wafer when the wafer is brought into contact with the top surface of the inner plug; and lowering the spider such that the lift ring moves to the lowered position thereof and the wafer becomes supported on the top surface of the inner plug.

6. The method of claim 5, wherein the top surface of the inner plug is substantially flat and horizontal.

7. The method of claim 5, further comprising:

lowering the spider such that the lift ring is supported on the inner plug and the inner plug is supported on the transition support members;

rotating the spider such that the support arms are positioned to contact the inner plug;

elevating the spider so that the inner plug is supported on the support arms, the support arms being received within recesses in a bottom surface of the inner plug; and rotating the spider as the wafer is processed.

8. A method of loading a wafer into a processing chamber having a temperature higher than that of the wafer, comprising:

positioning a wafer onto a lift ring within a processing chamber such that substantially an entire bottom outer peripheral surface of the wafer is supported by an upper wafer support surface of the lift ring, wherein positioning of the wafer onto the lift ring occurs when the lift ring is in an elevated position in which the upper wafer support surface is positioned above a top surface of an inner plug such that a wafer supported on the lift ring substantially does not contact the top surface of the inner plug; and lowering the lift ring into surrounding engagement with the inner plug, so that the inner plug is positioned within the central aperture of the lift ring and so that the top surface of the inner plug and the upper wafer support surface of the lift ring are generally coplanar, wherein at least one of said top surface and said upper wafer support surface supports a bottom surface of the wafer, wherein the engagement of the inner plug and the lift ring prevents relative rotation of the inner plug with respect to the lift ring when the lift ring is in the lowered position.

9. A method of processing a wafer on a susceptor within a processing chamber, the method comprising:

supporting an inner plug on a support spider, wherein the support spider has arms extending radially outward and upward to contact a bottom surface of a susceptor, the spider being vertically moveable and rotatable about a vertical axis, wherein the support spider is in one rotational position, and wherein a lift ring is in a lowered position thereof, supported on the inner plug;

lowering the spider to a position such that the inner plug becomes supported on a transition support member of a processing chamber, the lift ring remaining supported on the inner plug;

rotating the spider to a different rotational position such that the arms are underneath and positioned to contact portions of the lift ring but not the inner plug if the spider is elevated;

elevating the spider such that the lift ring moves to an elevated position thereof;

loading a wafer onto the lift ring in the elevated position thereof, wherein a surface of the lift ring contacts substantially an entire outer periphery of the wafer;

permitting the temperature of the wafer to increase to a level sufficient to substantially minimize thermal shock to the wafer when the wafer is brought into contact with a top surface of the inner plug; and lowering the spider such that the lift ring moves to the lowered position thereof and the wafer becomes supported on the top surface of the inner plug.

10. A method of processing a wafer on a susceptor within a processing chamber, the susceptor comprising an inner plug and a lift ring, the inner plug having a generally horizontal top surface, the lift ring forming a substantially closed ring, the lift ring having an upper wafer support surface configured to support a bottom outer peripheral surface of a wafer, the upper wafer support surface forming an unbroken encircling portion, the lift ring having a central aperture positioned such that the lift ring makes contact with substantially only a peripheral portion of a wafer supported thereon, wherein the contact between the peripheral portion of the wafer and the lift ring extends along a substantial portion of the circumference of the wafer, the central aperture being sized and shaped to receive the inner plug, the lift ring having a lowered position in which the wafer support surface is substantially coplanar with the top surface of the inner plug, the lift ring having an elevated position in which the wafer support surface is positioned above the top surface of the inner plug such that a wafer supported on the lift ring substantially does not contact the inner plug, the inner plug configured to support the lift ring when the lift ring is in the lowered position, the method comprising:

with the lift ring in the lowered position thereof, supporting the inner plug on a support spider having arms extending radially outward and upward to contact a bottom surface of the susceptor, the spider being vertically moveable and rotatable about a vertical axis;

lowering the spider to a position such that the inner plug becomes supported on transition support members of the processing chamber, the lift ring remaining supported on the inner plug;

rotating the spider such that the arms are underneath and positioned to contact portions of the lift ring but not the inner plug if the spider is elevated;

elevating the spider such that the lift ring moves to the elevated position thereof;

loading a wafer onto the lift ring in the elevated position thereof;

permitting the temperature of the wafer to increase to a level sufficient to substantially minimize thermal shock to the wafer when the wafer is brought into contact with the top surface of the inner plug; and lowering the spider such that the lift ring moves to the lowered position thereof and the wafer becomes supported on the top surface of the inner plug.

11. The method of claim 10, further comprising:

lowering the spider such that the lift ring is supported on the inner plug and the inner plug is supported on the transition support members;

rotating the spider such that the support arms are positioned to contact the inner plug;

elevating the spider so that the inner plug is supported on the support arms, the support arms being received within recesses in a bottom surface of the inner plug; and rotating the spider as the wafer is processed.

12. A method of loading a wafer in a processing chamber, said method comprising:

positioning a wafer onto a lift ring within a processing chamber such that substantially an entire bottom outer peripheral surface of the wafer is supported by a substantially flat upper wafer support surface of the lift ring, the upper wafer support surface being a top surface of the lift ring, the lift ring having a central aperture configured so that only an outer peripheral portion of the wafer is in contact with the lift ring, the central aperture further being sized and shaped to receive an inner plug;

lowering the lift ring into surrounding engagement with the inner plug, so that the inner plug is positioned within the central aperture of the lift ring and so that a top surface of the inner plug and the upper wafer support surface of the lift ring are generally coplanar, at least one of said top surface and said upper wafer support surface supporting a bottom surface of the wafer; and engaging features of the inner plug with interconnecting features of the lift ring such that relative rotation of the inner plug with respect to the lift ring is prevented when the lift ring is in the lowered position.

13. A method of holding a wafer, said method comprising:

placing a wafer onto a lift ring, the lift ring forming a substantially closed ring, wherein a top surface of the lift ring does not extend vertically over the wafer, wherein the lift ring makes contact with substantially only the peripheral edge of the wafer, wherein said lift ring forms an unbroken encircling portion, wherein the contact between the peripheral edge of the wafer and the lift ring extends along substantially the entire circumference of the wafer, and wherein said lift ring is in an elevated position with respect to an inner plug so that said wafer does not contact the inner plug;

lowering the lift ring to a lowered position in which a wafer contacting surface of the lift ring is substantially coplanar with a top surface of the inner plug, wherein said lift ring has a central aperture that is sized and shaped to receive the inner plug; and preventing relative rotation between the inner plug and the lift ring when the lift ring is in the lowered position.

14. The method of claim 13, further comprising, prior to lowering the lift ring to the lowered position, lowering the lift ring to a point above the lowered position so as to allow the inner plug to heat the wafer on the lift ring, without contacting the wafer with the inner plug.

15. The method of claim 13, wherein the inner plug has a generally horizontal top surface.

16. A method for holding a wafer in a reaction chamber, said method comprising:

supporting substantially an entire bottom outer peripheral surface of a wafer with a lift ring, while not contacting an inner portion of the wafer, the lift ring forming a substantially closed ring;

supporting the wafer above an inner plug with the lift ring without any contact between the wafer and the inner plug, so as to allow the inner plug to heat the wafer;

once the wafer has been heated to a temperature sufficient to prevent thermal shock to the wafer if the wafer contacts the inner plug, lowering the wafer into contact with the inner plug;

lowering the lift ring such that the inner portion of the wafer contacts the inner plug and such that the lift ring is supported by the inner plug; and rotating the inner plug.

\* \* \* \* \*